United States Patent
Smith et al.

(10) Patent No.: US 11,508,903 B2
(45) Date of Patent: Nov. 22, 2022

(54) SPIN ORBIT TORQUE DEVICE WITH INSERTION LAYER BETWEEN SPIN ORBIT TORQUE ELECTRODE AND FREE LAYER FOR IMPROVED PERFORMANCE

(71) Applicant: Intel Corporation, Santa Clara, CA (US)

(72) Inventors: Angeline Smith, Hillsboro, OR (US); Ian Young, Portland, OR (US); Kaan Oguz, Portland, OR (US); Sasikanth Manipatruni, Portland, OR (US); Christopher Wiegand, Portland, OR (US); Kevin O'Brien, Portland, OR (US); Tofizur Rahman, Portland, OR (US); Noriyuki Sato, Hillsboro, OR (US); Benjamin Buford, Hillsboro, OR (US); Tanay Gosavi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 971 days.

(21) Appl. No.: 16/022,094

(22) Filed: Jun. 28, 2018

(65) Prior Publication Data

US 2020/0006626 A1 Jan. 2, 2020

(51) Int. Cl.
*H01L 43/02* (2006.01)
*H01L 27/22* (2006.01)
*H01L 43/10* (2006.01)

(52) U.S. Cl.
CPC ............ *H01L 43/02* (2013.01); *H01L 27/228* (2013.01); *H01L 43/10* (2013.01)

(58) Field of Classification Search
CPC ........ H01L 43/02; H01L 43/10; H01L 27/228
See application file for complete search history.

(56) References Cited

U.S. PATENT DOCUMENTS

| | | | |
|---|---|---|---|
| 10,340,445 | B2 | 7/2019 | Oguz et al. |
| 10,916,284 | B2 | 2/2021 | Le et al. |
| 2004/0125673 | A1 | 7/2004 | Daughton et al. |
| 2005/0285168 | A1 | 12/2005 | Worledge et al. |
| 2013/0062715 | A1 | 3/2013 | Chen et al. |
| 2014/0056060 | A1 | 2/2014 | Khvalkovskiy et al. |

(Continued)

FOREIGN PATENT DOCUMENTS

| | | |
|---|---|---|
| WO | 2017052606 | 3/2017 |
| WO | 2019005158 | 1/2019 |
| WO | 2019125381 | 6/2019 |

OTHER PUBLICATIONS

Extended European Search Report from European Patent Application No. 19175815.0 notified Dec. 5, 2019, 8 pgs.

(Continued)

*Primary Examiner* — Marc Anthony Armand
(74) *Attorney, Agent, or Firm* — Essential Patents Group, LLP

(57) ABSTRACT

An insertion layer for perpendicular spin orbit torque (SOT) memory devices between the SOT electrode and the free magnetic layer, memory devices and computing platforms employing such insertion layers, and methods for forming them are discussed. The insertion layer is predominantly tungsten and improves thermal stability and perpendicular magnetic anisotropy in the free magnetic layer.

19 Claims, 11 Drawing Sheets

(56) References Cited

U.S. PATENT DOCUMENTS

| | | |
|---|---|---|
| 2014/0269036 A1* | 9/2014 | Pi .......................... G11C 11/18 365/158 |
| 2015/0008547 A1 | 1/2015 | Pi et al. |
| 2015/0041934 A1 | 2/2015 | Khvalkovskiy et al. |
| 2015/0171316 A1 | 6/2015 | Park et al. |
| 2017/0069827 A1 | 3/2017 | Lee et al. |
| 2017/0076769 A1 | 3/2017 | Shirotori et al. |
| 2017/0092848 A1 | 3/2017 | Jang et al. |
| 2017/0125078 A1 | 5/2017 | Mihajlovic et al. |
| 2017/0178705 A1* | 6/2017 | Buhrman ................ G11C 11/18 |
| 2018/0114898 A1* | 4/2018 | Lee ........................ H01L 43/04 |
| 2019/0304522 A1* | 10/2019 | Tahmasebi .............. H01L 43/12 |
| 2019/0304525 A1 | 10/2019 | Manipatruni et al. |
| 2019/0305216 A1 | 10/2019 | Gosavi et al. |
| 2019/0386205 A1 | 12/2019 | Gosavi et al. |
| 2020/0083286 A1 | 3/2020 | Manipatruni et al. |
| 2020/0083427 A1 | 3/2020 | Manipatruni et al. |
| 2020/0098410 A1 | 3/2020 | Gosavi et al. |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

OTHER PUBLICATIONS

Nambu, Yusuke, et al., "Two-dimensional magnetism and spin-size effect in the S=1 triangular antiferromagnet NiGa2S4", Journal of Physics Condensed Matter 23 (2011), 11 pgs.

\* cited by examiner

SPIN ORBIT TORQUE DEVICE WITH INSERTION LAYER BETWEEN SPIN ORBIT TORQUE ELECTRODE AND FREE LAYER FOR IMPROVED PERFORMANCE

BACKGROUND

Perpendicular spin orbit torque (pSOT) devices include an SOT electrode coupled with a magnetic junction such as a magnetic tunnel junction (MTJ). For example, an MTJ includes free and fixed magnets separated by a tunnel barrier such that the fixed and free magnets have perpendicular magnetic anisotropy (PMA) (i.e., out of the plane of a substrate and/or MTJ layers) and such that the free magnet is on the SOT electrode. The MTJ is used to switch and detect the state of the memory. When the magnetization directions of the free and fixed magnets are parallel the MTJ resistance is in a low state and when the magnetization directions are antiparallel the MTJ resistance is in a high state. The relative magnetization directions are provided or written to the memory by varying the magnetization direction of the free magnet while the magnetization direction of the fixed magnet remains, as the name implies, fixed.

Non-volatile embedded memory with pSOT memory devices (e.g., on-chip embedded memory) can enable energy and computational efficiency. However, challenges in developing suitable pSOT devices, particularly those having SOT electrodes with properties that allow the pSOT device to survive back end processing (e.g., at temperatures greater than 410° C.), persist. In particular, it would be advantageous to provide pSOT memory devices having increased thermal stability, retention, and PMA after back end processing.

It is with respect to these and other considerations that the present improvements have been needed. Such improvements may become critical as the implementation of pSOT devices in a variety of contexts becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Furthermore, where considered appropriate, reference labels have been repeated among the figures to indicate corresponding or analogous elements. In the figures.

DETAILED DESCRIPTION

Figure 1A:
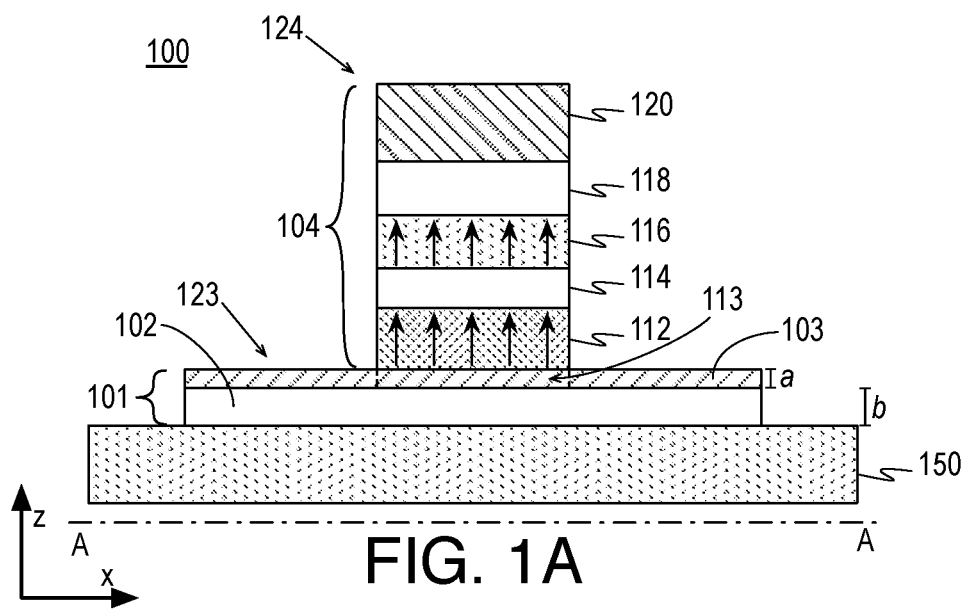
FIG. 1A illustrates a cross-sectional view of a perpendicular spin orbit torque memory device having a tungsten insertion layer.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Furthermore, the terms "substantially," "close," "approximately," "near," and "about," generally refer to being within +/−10% of a target value. The term layer as used herein may include a single material or multiple materials.

The term "free" or "unfixed" as used herein with reference to a magnet refers to a magnet whose magnetization direction can change along its easy axis upon application of an external field or force (e.g., Oersted field, spin torque, etc.). Conversely, the term "fixed" or "pinned" as used herein with reference to a magnet refers to a magnet whose magnetization direction is pinned or fixed along an axis and which may not change due to application of an external field (e.g., electrical field, Oersted field, spin torque, etc.). As used herein, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees ±20 degrees relative to an x-y plane of a device. Furthermore, the term "device" generally refers to an apparatus according to the context of the usage of the term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Perpendicular spin orbit torque material stacks, apparatuses, devices, systems, computing platforms, and methods are described below related to perpendicular spin orbit torque devices having a predominantly tungsten layer between a spin orbit torque electrode and a free magnetic material layer for improved performance.

As described above, it may be advantageous to provide perpendicular spin orbit torque (pSOT) devices with improved thermal stability, retention and perpendicular magnetic anisotropy (PMA) particularly after back end processing. In some embodiments, a pSOT device includes an SOT electrode or electrode layer and a predominantly tungsten layer on the SOT electrode layer. The SOT electrode includes any suitable material that provides high spin orbit coupling SOC such as one or more of Ta, Pt, Hf, HfO, Co, or IrMn. The SOT electrode may be a single material layer or layers of multiple materials. As discussed, a predominantly tungsten layer is on the SOT electrode layer. As used herein, the term predominantly indicates the predominant constituent is the constituent of greatest proportion in the layer or material. In some embodiments, the tungsten layer is pure or nearly pure tungsten (e.g., greater than 99% tungsten or more). The pSOT device further includes a magnetic junction including a free magnetic material layer such that the free magnetic material layer is on the predominantly tungsten layer. For example, the magnetic junction may be an MTJ including the free magnetic material layer and a fixed magnetic material layer separated by a tunnel barrier layer such that the free magnetic material layer is on the predominantly tungsten layer. The free and fixed magnet layers have PMA, which is characterized by a magnetic easy axis that is substantially perpendicular to planes of the fixed and free magnet layers (and in-line with their thicknesses). Such PMA may be contrasted with in-plane magnetic anisotropy, which is parallel or in-plane with respect to the plane of the layer. The perpendicular magnetic anisotropy of the fixed and free magnet layers is provided or established based on material selection, the thickness of the layers of such materials, and/or the interfaces of the layers with their respective adjoining materials.

The discussed predominantly tungsten layer between the SOT electrode and the free magnetic material layer improves the device performance. For example, absent the predominantly tungsten layer, the SOT electrode layer may act as a boron getter (particularly in examples using tantalum), which causes diffusion of boron from magnetic material layers employing Co, Fe, and B, especially at higher temperatures such as those used for back end processing (e.g., greater than 410° C.). Inclusion of the predominantly tungsten insertion layer eliminates or diminishes such B diffusion thereby maintaining the composition of the magnetic material layers for improved retention and thermal stability. Predominantly tungsten insertion layers provide additional benefits over other SOT electrode materials such as topological insulators such as ease of fabrication at on large substrates (e.g., 300 mm wafers) and low cost. Furthermore, the predominantly tungsten insertion layer provides a surface topology and material structure advantageous for formation of the free magnet layer.

Figure 1B:
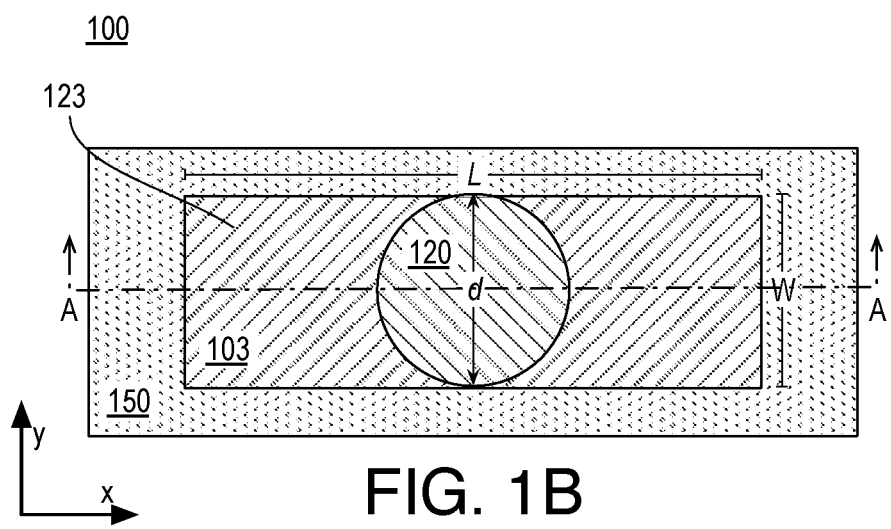
FIG. 1B illustrates a top-down view of the perpendicular spin orbit torque memory device of FIG. 1A.

FIG. 1A illustrates a cross-sectional view of a perpendicular spin orbit torque memory device 100 having a tungsten insertion layer and FIG. 1B illustrates a top-down view of perpendicular spin orbit torque memory device 100, arranged in accordance with at least some implementations of the present disclosure. As shown, the cross-sectional view of FIG. 1A is taken along the A-A plane of the top-down view of FIG. 1B such that the view of FIG. 1A is along the x-z plane. As shown, perpendicular spin orbit torque (pSOT) memory device 100 is over or on a substrate 150 and pSOT memory device 100 includes an electrode structure 101, which includes an SOT electrode layer 102 and a tungsten insertion layer 103, which is predominantly tungsten. Furthermore, pSOT memory device 100 includes a material stack 124 for a magnetic tunnel junction (MTJ) device 104 on electrode structure 101. For example, any number of the material layers illustrated with respect to material stack 124 may be characterized as a material stack for MTJ device 104. As illustrated, in some embodiments, MTJ device 104 is a perpendicular MTJ (pMTJ) device. In an embodiment, material stack 124 includes a free magnetic material layer 112, a tunnel barrier layer 114, a fixed magnetic material layer 116, an optional synthetic antiferromagnetic (SAF) layer 118, and a top electrode layer 120.

As shown, free magnetic material layer 112 is on tungsten insertion layer 103. In some embodiments, free magnetic material layer 112 includes a ferromagnetic material that has perpendicular magnetic anisotropy (PMA) (e.g., in the z-direction as illustrated with respect to the arrows therein). Free magnetic material layer 112 may include a single free magnetic material or a stack of free magnetic materials magnetically coupled through intervening metal coupling layers. Tunnel barrier layer 114 is on or over free magnetic material layer 112 (and between free magnetic material layer 112 and fixed magnetic material layer 116). Fixed magnetic material layer 116 is on or over tunnel barrier layer 114. Fixed magnetic material layer 116 may include a single fixed magnetic material or a stack of fixed magnetic materials magnetically coupled through intervening metal coupling layers. Optional synthetic antiferromagnetic (SAF) layer 118 is on or over fixed magnetic material layer 116. In an embodiment, SAF layer 118 is a multilayer stack including a non-magnetic layer between a first magnetic layer and a second magnetic layer. In some embodiments, the first and second magnetic layers each include a metal such as, but not limited to cobalt, nickel, platinum, or palladium. In an embodiment, the non-magnetic layer between the first and second magnetic layers is or includes ruthenium. In an embodiment, the non-magnetic layer between the first and second magnetic layers is ruthenium having a thickness in the range of 0.4 to 1 nm. Electrode layer 120 (e.g., a top electrode or terminal electrode) is on or over SAF layer 118.

Substrate 150 may include any suitable material(s) for the formation of pSOT memory device 100 and/or underlying devices. In an embodiment, substrate 150 includes a suitable semiconductor material such as but not limited to, single crystal silicon, polycrystalline silicon and silicon on insulator (SOI). In some embodiments, substrate 150 includes a dielectric layer. In an embodiment, substrate 150 includes semiconductor materials such as germanium, silicon germanium or a suitable group III-N or a group III-V compound. Logic devices such as MOSFET transistors and access transistors and may be within or on substrate 150. Logic devices such as access transistors may be integrated with memory devices such as SOT memory devices to form embedded memory. In some embodiments, embedded memory including pSOT memory device 100 and logic MOSFET transistors are combined to form a functional integrated circuit such as a system on chip.

In operation, electrode structure 101 provides spin orbit coupling (SOC) to electrons that flow through electrode structure 101 as is discussed further herein. Such SOC is provided by at least SOT electrode layer 102. SOT electrode layer 102 may be any suitable material or materials that provide SOC such as, for example, Ta, Pt, Hf, HfO, Co, or IrMn. SOT electrode layer 102 may be a pure or nearly pure layer of such materials (e.g., 99% by weight) or a multilayer stack of such materials. In an embodiment, SOT electrode layer 102 is tantalum. In an embodiment, SOT electrode layer 102 is beta-phase tantalum (i.e., tetragonal tantalum, β-Ta). In an embodiment, SOT electrode layer 102 is platinum. In an embodiment, is hafnium. In an embodiment, SOT electrode layer 102 is hafnium oxide such that SOT electrode layer 102 includes Hf and O. In an embodiment, SOT electrode layer 102 is cobalt. In an embodiment, SOT electrode layer 102 is iridium manganese such that SOT electrode layer 102 includes Ir and Mn. Such materials can generate spin orbit torque in response to an electric current. For example, IrMn is an alloy material that can generate spin orbit torque in response to an electric current and can also act as an antiferromagnetic material where the spin domains are antiferromagnetically ordered.

SOT electrode layer 102 may have any suitable film thickness, b, as shown in FIG. 1A. As used herein, the term film thickness indicates a thickness (e.g., in the z-direction) of the particular material or film and may be characterized in being an average thickness, a median thickness, a maximum thickness, a minimum thickness, etc. of the material or film. Such a film thickness may be contrasted with, for example, the length and width or diameter of the film which is generally a greater dimension by at least an order of magnitude. For example, the material or film may not have an entirely consistent thickness although such materials or films typically have a substantially uniform thickness (e.g., within +/−10% of a target value). Such a film thickness may be contrasted with, for example, the length and width or diameter of the film which is generally a greater dimension by at least an order of magnitude. In an embodiment, SOT electrode layer 102 has a film thickness of not less than 2 nm and not more than 20 nm. Furthermore, tungsten insertion layer 103 may provided additional SOC in operation of the device.

Tungsten insertion layer 103 is on SOT electrode layer 102 and is predominantly tungsten (i.e., the constituent having the greatest proportion in insertion layer 103 is tungsten). In some embodiments, tungsten insertion layer 103 is pure or nearly pure tungsten. In an embodiment, tungsten insertion layer 103 is not less than 95% tungsten by weight (e.g., the mass fraction of tungsten in tungsten insertion layer 103 is not less than 95%). In an embodiment, tungsten insertion layer 103 is not less than 99% tungsten by weight. In an embodiment, tungsten insertion layer 103 is not less than 99.9% tungsten by weight. In embodiments where SOT electrode layer 102 is or includes tantalum such as beta-phase tantalum, tungsten insertion layer 103 is notable in that it is absent of tantalum. In particular, tungsten insertion layer 103 may provide a tantalum free thickness on SOT electrode layer 102. Tungsten insertion layer 103 may be characterized as a tungsten protective layer, a tungsten cladding, etc.

Tungsten insertion layer 103 may have any suitable thickness, a, as shown in FIG. 1A. In an embodiment, tungsten insertion layer 103 has a thickness of not less than 0.05 nm. Notably, a thickness of not less than 0.05 nm between SOT electrode layer 102 and free magnetic material layer 112 may stop or diminish diffusion of boron from free magnetic material layer 112 into SOT electrode layer 102 for improved PMA and thermal stability. In an embodiment, tungsten insertion layer 103 has a thickness of not less than 0.05 nm and not more than 0.8 nm. In an embodiment, tungsten insertion layer 103 has a thickness in the range of 0.05 to 0.8 nm (e.g., not less than 0.05 nm and not more than 0.8 nm). In an embodiment, tungsten insertion layer 103 has a thickness of not more than 1 nm. In an embodiment, tungsten insertion layer 103 has a thickness in the range of 0.05 to 1 nm (e.g., not less than 0.05 nm and not more than 1 nm). In an embodiment, tungsten insertion layer 103 has a thickness in the range of 0.05 to 1.5 nm (e.g., not less than 0.05 nm and not more than 1.5 nm). Notably, a thin magnetic material layer 112 (i.e., having a thickness of not more than 0.8 nm, 1 nm, or 1.5 nm) may stop or diminish diffusion of boron as discussed while advantageously leaving a smaller distance between SOT electrode layer 102 and free magnetic material layer 112). In an embodiment, tungsten insertion layer 103 has a thickness of not more than 2 nm. In an embodiment, tungsten insertion layer 103 has a thickness in the range of 0.05 to 5 nm (e.g., not less than 0.05 nm and not more than 5 nm). In an embodiment, tungsten insertion layer 103 has a thickness in the range of 0.05 to 2 nm (e.g., not less than 0.05 nm and not more than 2 nm). In an embodiment, tungsten insertion layer 103 has a thickness of about 2 nm (e.g., not less than 1 nm and not more than 3 nm). In an embodiment, tungsten insertion layer 103 has a thickness of about 1 nm (e.g., not less than 0.05 nm and not more than 1.5 nm). In an embodiment, tungsten insertion layer 103 is not less than 99% tungsten by weight and has a film thickness of not less than 0.5 nm. In an embodiment, tungsten insertion layer 103 is not less than 99% tungsten by weight and has a film thickness of not less than 0.5 nm and not more than 2 nm. In an embodiment, tungsten insertion layer 103 is not less than 99% tungsten by weight and has a film thickness of not less than 0.5 nm and not more than 1.5 nm. In an embodiment, tungsten insertion layer 103 has a thickness of about 3 nm (e.g., not less than 2.8 nm and not more than 3.2 nm). In an embodiment, tungsten insertion layer 103 has a thickness of not less than 0.5 nm and not more than 1.5 nm.

Notably, tungsten insertion layer 103 includes a region or portion 113 that is between SOT electrode layer 102 and free magnetic material layer 112 and a region or portion 123 that is laterally external (e.g., in the x-y plane) the region between SOT electrode layer 102 and free magnetic material layer 112 and on SOT electrode layer 102. For example, portion 113 is between SOT electrode layer 102 and free magnetic material layer 112 such that portion 113 is laterally within the sidewall dimensions of free magnetic material layer 112 (as shown by the vertical hatched lines in tungsten insertion layer 103. As shown with respect to FIG. 1B, portion 123 is external or exposed from free magnetic material layer 112 and material stack 124 (of which only the top of terminal electrode layer 120 is illustrated). For example, portion 123 is not under free magnetic material layer 112 and extends to an outer edge of SOT electrode layer 102.

Inclusion of tungsten insertion layer 103, particularly portion 113, provides a variety of benefits for the fabrication and operation of pSOT device 100. For example, pSOT device 100 requires a SOT electrode (e.g., a bottom electrode) with SOC as provided at least by SOT electrode layer 102. Inclusion of tungsten insertion layer 103 further provides for pSOT device 100 to better handle back end processing (e.g., at temperatures greater than 410° C.) due to tungsten insertion layer 103 being a diffusion barrier, particularly from boron in free magnetic material layer 112 diffusing to SOT electrode layer 102. For example, SOT electrode layer 102 may be a material that is a boron getter and would otherwise diminish the performance of free magnetic material layer 112. That is, tungsten at the interface between tungsten insertion layer 103 and free magnetic material layer 112 reduces or eliminates boron diffusion at high temperatures for increased thermal stability of free magnetic material layer 112. Thereby, tungsten insertion layer 103 provides for improved thermal stability of free magnetic material layer 112. Furthermore, inclusion of tungsten insertion layer 103 provides for easier growth of free magnetic material layer 112 and improved PMA of free magnetic material layer 112. For example, at the same thickness, free magnetic material layer 112 has a higher magnetic moment and higher coercivity when deposited on tungsten insertion layer 103 than other materials such as those discussed with respect to SOT electrode layer 102.

As shown with respect to the arrows indicating magnetic moments in free magnetic material layer 112 and fixed magnetic material layer 116, in some embodiments, material stack 124 provides a perpendicular magnetic system such that the magnetic easy axes of the magnetic material layers 112, 116 are in the z-direction out of the plane of substrate 150. Fixed magnetic material layer 116 may be composed of any material or stack of materials suitable for maintaining a fixed magnetization direction while free magnetic material layer 112 may be composed of any material or stack of materials that is magnetically softer (e.g., magnetization may more easily rotate to parallel and antiparallel state) with respect to fixed magnetic material layer 116). Fixed magnetic material layer 116 may be characterized as a fixed/pinned magnet, a fixed/pinned magnet layer, or a fixe/pinned magnetic stack.

In some embodiments, material stack 124 is based on a CoFeB/MgO system including fixed magnetic material layer 116 composed of CoFeB, tunnel barrier layer 114 composed of MgO, and free magnetic material layer 112 composed of CoFeB. That is, in some embodiments, fixed magnetic material layer 116 include one or more of Co, Fe, and B, tunnel barrier layer 114 includes one or more of Mg and O, and free magnetic material layer 112 include one or more of Co, Fe, and B. In some embodiments, all CoFeB layers have body-centered cubic (BCC) (001) out-of-plane texture such that texture herein refers to the majority distribution of crystallographic orientations within the layers of material stack 124. In some embodiments, the CoFeB magnetic material layers 112, 116 are iron-rich alloys for increased magnetic perpendicularity. For example, an iron-rich alloy is an alloy having more iron than cobalt. Other magnetic material systems may be used for fixed magnetic material layer 116 and/or free magnetic material layer 112 such as Co, Fe, Ni systems.

As discussed, in some embodiments, free magnetic material layer 112 is CoFeB. In some embodiments, free magnetic material layer 112 has a thickness in the range of 1 to 2.5 nm. For example, a free magnetic material layer 112 having a thickness of less than 2.5 nm exhibits PMA. In some embodiments, free magnetic material layer 112 has a thickness in the range of 0.6 to 1.6 nm. Furthermore, interfacial PMA may be provided from iron-oxygen hybridization between free magnetic material layer 112 with tunnel barrier layer 114. In an embodiment, magnetic material layer 112 includes a magnetic material such as CoB, FeB, CoFe or CoFeB. In some embodiments magnetic material layer 112 includes a $Co_{100-x-y}Fe_xB_y$, where X and Y each represent atomic percent, further where X is between 50 and 80 and Y is between 10 and 40, and further where the sum of X and Y is less than 100.

In some embodiments, fixed magnetic material layer 116 has a thickness in the range of 0.1 to 1 nm. In some embodiments, free magnetic material layer 112 has a thickness that is less than the thickness of fixed magnetic material layer 116. In an embodiment, fixed magnetic material layer 116 is composed of a single layer of CoFeB. In an embodiment, fixed magnetic material layer 116 has a thickness in the range of 2 to 3 nm. As discussed, fixed magnetic material layer 116 and free magnetic material layer 112 have PMA and material stack 124 is in a high resistance state when direction of magnetization in free magnetic material layer 112 is antiparallel (opposite) to the direction of magnetization in fixed magnetic material layer 116 and is in a low resistance state when direction of magnetization in free magnetic material layer 112 is parallel to the direction of magnetization in fixed magnetic material layer 116 (as illustrated). Changes in state are affected as discussed further herein. In an embodiment, fixed magnetic material layer 116 includes an alloy such as CoFe or CoFeB. In an embodiment, fixed magnetic material layer 116 is $Co_{100-x-y}Fe_xB_y$, where X and Y each represent atomic percent, further where X is between 50 and 80 and Y is between 10 and 40, and further where the sum of X and Y is less than 100.

Tunnel barrier layer 114 is any material or materials that allow current of a majority spin to pass, while impeding current of a minority spin (e.g., a spin filter). In some embodiments, tunnel barrier layer 114 is or includes magnesium oxide (MgO) and tunnel barrier layer 114 includes at least magnesium and oxygen. In some embodiments, tunnel barrier layer 114 is or includes magnesium aluminum oxide (MgAlO) and tunnel barrier layer 114 includes at least magnesium, aluminum, and oxygen. In some embodiments, tunnel barrier layer 114 is or includes aluminum oxide ($Al_2O_3$). Tunnel barrier layer 114 may provide a crystallization structure (e.g., BCC with (001) texture) for solid phase epitaxy of fixed magnetic material layer 116. Tunnel barrier layer 114 may be characterized as a barrier layer, a tunneling layer, or an oxide layer. In some embodiments, tunnel barrier layer 114 is not used. Tunnel barrier layer 114 may have any suitable thickness in the range of, for example, 0.3 nm to 2 nm.

Electrode layer 120 may include any suitable conductive material(s). In an embodiment, electrode layer 120 is composed of a material or stack of materials suitable for electrically contacting SAF layer 118 of material stack 124. In some embodiment, electrode layer 120 is a topographically smooth electrode. In an embodiment, electrode layer 120 is composed of ruthenium layers interleaved with tantalum layers. In an embodiment, electrode layer 120 is titanium nitride. In an embodiment, electrode layer 120 has a thickness in the range of 100 to 200 nm. In an embodiment, electrode layer 120 has a thickness of not less than 100 nm. In an embodiment, electrode layer 120 includes one or more of ruthenium, tantalum, tantalum nitride, or titanium nitride. In an embodiment, electrode layer 120 includes a material suitable to provide a hardmask for etching material stack 124 to form pSOT memory device 100. Electrode layer 120 may be characterized as an electrode, a terminal electrode, a metal electrode, etc.

With reference to FIG. 1B, electrode structure 101, including SOT electrode layer 102 and tungsten insertion layer 103 may extend laterally beyond MTJ device 104 such that portion 123 of tungsten insertion layer 103 is exposed. As is discussed further herein, contact may be made to pSOT device 100 via electrode structure 101 on both sides of MTJ device 104 and to electrode layer 120 of MTJ device 104 (e.g., pSOT device 100 is a three-terminal device). Contact to electrode structure 101 may be made on opposite sides MTJ device 104 with both contacts on tungsten insertion layer 103 (e.g., both contacts lateral to MTJ device 104), both contacts on SOT electrode layer 102 (e.g., both contacts on an opposite side of electrode structure 101 with respect to MTJ device 104), or one contact on each of tungsten insertion layer 103 and SOT electrode layer 102 (e.g., one contact lateral to MTJ device 104 and one contact on an opposite side of electrode structure 101 with respect to MTJ device 104).

In an embodiment, MTJ device 104 is approximately in the center of electrode structure 101 (as illustrated). In the illustrative embodiment, electrode structure 101 has a rectangular profile in the x-y plane and MTJ device 104 has a circular profile in the x-y plane. In other embodiments, MTJ device 104 has a square, rectangular, or elliptical profile in the x-y plane. Electrode structure 101 may be any suitable size and shape in the x-y plane. In an embodiment, electrode structure 101 has a length, L, in the range of 100 nm to 500 nm and a width, W, in the range of 10 nm to 50 nm. In an embodiment, MTJ device 104 has a broadest cross-sectional diameter, d, that is similar or substantially similar to width, W (e.g., in the range of 10 nm to 50 nm).

Figure 2A:
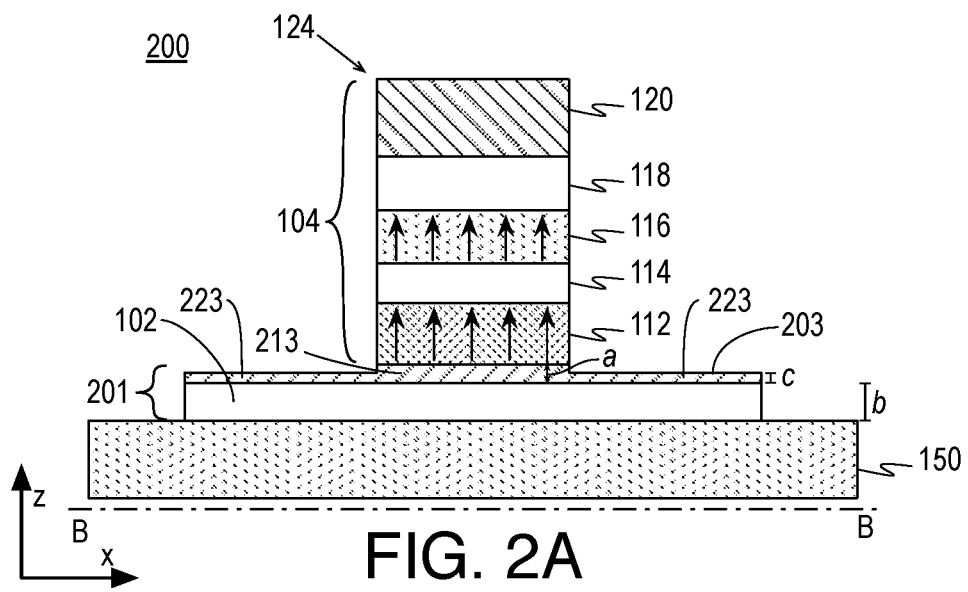
FIG. 2A illustrates a cross-sectional view of a perpendicular spin orbit torque memory device having a tungsten insertion layer with differing thicknesses.
Figure 2B:
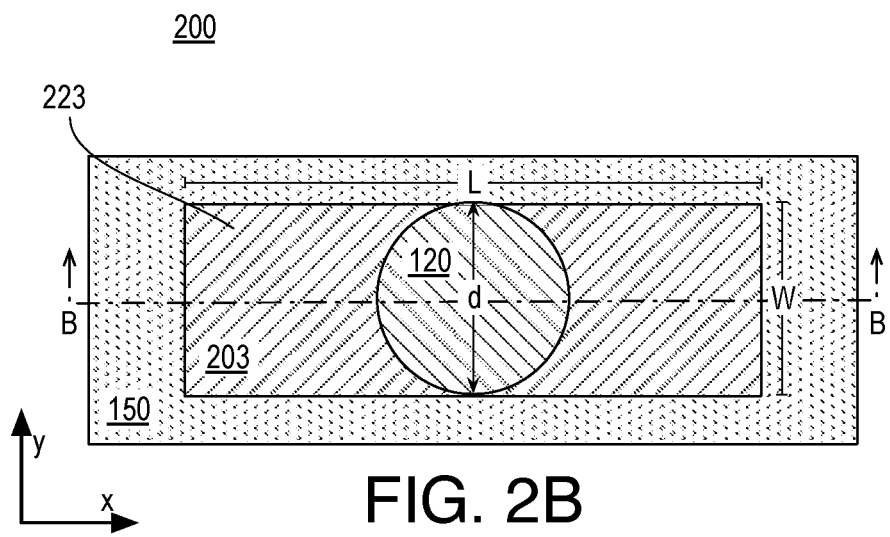
FIG. 2B illustrates a top-down view of the perpendicular spin orbit torque memory device of FIG. 2A.

FIG. 2A illustrates a cross-sectional view of a perpendicular spin orbit torque memory device 200 having a tungsten insertion layer 103 with differing thicknesses and FIG. 2B illustrates a top-down view of perpendicular spin orbit torque memory device 200, arranged in accordance with at least some implementations of the present disclosure. As shown, the cross-sectional view of FIG. 2A is taken along the B-B plane of the top-down view of FIG. 2B such that the view of FIG. 2A is along the x-z plane. Herein, like materials and components are labeled with like reference numerals. Notably, with respect to pSOT memory device 100, perpendicular spin orbit torque (pSOT) memory device 200, has an electrode structure 201 including a tungsten insertion layer 203 having a first film thickness, a, between SOT electrode layer 102 and free magnetic material layer 112 and a second film thickness, c, over SOT electrode layer 102 and external to free magnetic material layer 112 such that the first film thickness, a, is greater than the second film thickness, c. Like components of pSOT memory device 200 may have any characteristics (e.g., materials, dimensions, etc.) as discussed with respect to any pSOT memory device discussed herein such as pSOT memory devices 100, 300.

As shown, tungsten insertion layer 203 is on SOT electrode layer 102. Tungsten insertion layer 203 is predominantly tungsten as discussed herein with respect to tungsten insertion layer 103. In some embodiments, tungsten insertion layer 203 is pure or nearly pure tungsten. In an embodiment, tungsten insertion layer 203 is not less than 95% tungsten by weight. In an embodiment, tungsten insertion layer 203 is not less than 99% tungsten by weight. In an embodiment, tungsten insertion layer 203 is not less than 99.9% tungsten by weight. In some embodiments, tungsten insertion layer 203 is notable in that it is absent of tantalum such that it provides a tantalum free thicknesses, a and c, on SOT electrode layer 102.

As shown, tungsten insertion layer 203 includes a region or portion 213 that is between SOT electrode layer 102 and free magnetic material layer 112 and a region or portion 223 (or regions or portions) that is external to the region or portion (i.e., portion 213) between SOT electrode layer 102 and free magnetic material layer 112 and on SOT electrode layer 102. In an embodiment, portion 213 is between SOT electrode layer 102 and free magnetic material layer 112 such that portion 213 is laterally within the sidewall dimensions of free magnetic material layer 112. In some embodiments, portion 213 may extend laterally from such sidewall dimensions by any distance such as 1 to 5 nm. In such embodiments, tungsten insertion layer 203 again has a first film thickness between SOT electrode layer 102 and free magnetic material layer 112 and a second film thickness over SOT electrode layer 102 external to free magnetic material layer 112 such that the first film thickness is greater than the second film thickness. For example, the lateral thickness, c, is laterally between a sidewall of free magnetic material layer 112 and an outer edge of SOT electrode layer 102. As shown with respect to FIG. 2B, portion 223 is external or exposed from free magnetic material layer 112 and material stack 124 (of which only the top of terminal electrode layer 120 is illustrated).

First film thickness, a, of tungsten insertion layer 203 may be any film thickness discussed with respect to thickness, a, as described with respect to tungsten insertion layer 103. Second film thickness, c, of tungsten insertion layer 203 may be any suitable value that is less than first film thickness, a, of tungsten insertion layer 203. In an embodiment, second film thickness, c, is in the range of 40% to 60% of the first film thickness, a, with 50% being particularly advantageous. In an embodiment, second film thickness, c, is in the range of 20% to 50% of the first film thickness, a. In an embodiment, second film thickness, c, is in the range of 10% to 30% of the first film thickness, a. As discussed further herein, second film thickness, c, being less than first film thickness, a, may be provided during a patterning etch of material stack 124. In an embodiment, second film thickness, c, is in the range of 0.25 to 3.5 nm (e.g., not less than 0.25 nm and not more than 3.5 nm). In an embodiment, first film thickness, a, is not less than 0.5 nm and second film thickness, c, is less than 0.5 nm. In an embodiment, second film thickness, c, is in the range of 0.25 to 1 nm (e.g., not less than 0.25 nm and not more than 1 nm). In an embodiment, second film thickness, c, is about 1 nm (e.g., not less than 0.5 nm and not more than 1.5 nm). In an embodiment, second film thickness, c, is about 0.5 nm (e.g., not less than 0.25 nm and not more than 0.9 nm). In an embodiment, second film thickness, c, is about 1.8 nm (e.g., not less than 1.2 nm and not more than 2.4 nm).

Figure 3A:
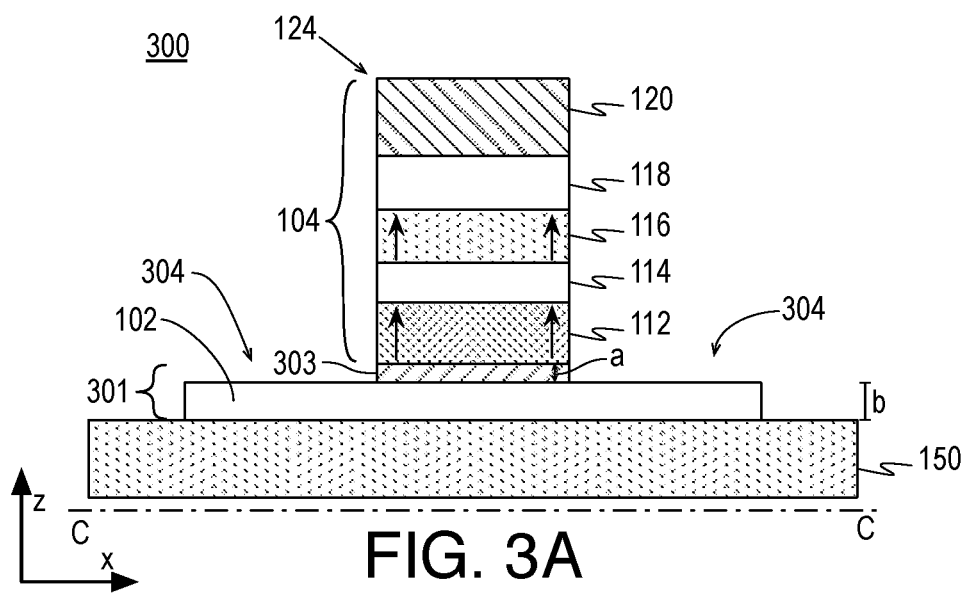
FIG. 3A illustrates a cross-sectional view of a perpendicular spin orbit torque memory device 300 having a tungsten insertion layer within a free magnetic material layer 112.
Figure 3B:
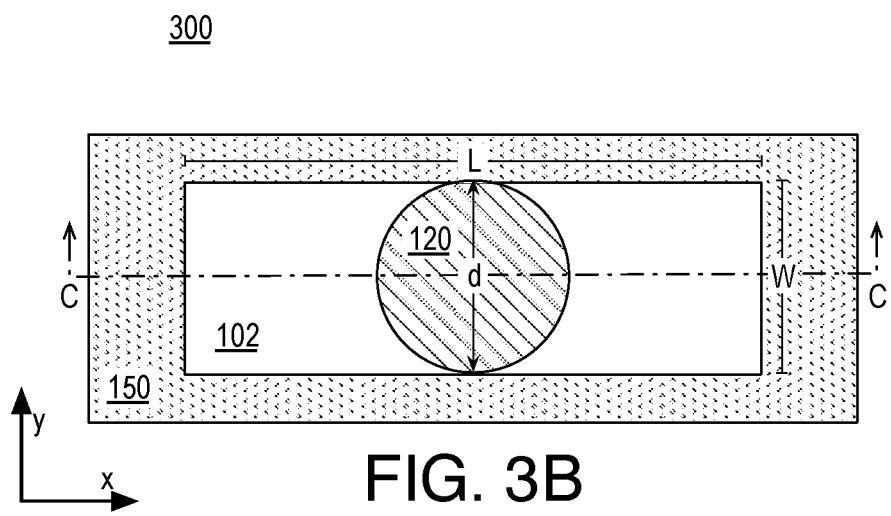
FIG. 3B illustrates a top-down view of the perpendicular spin orbit torque memory device of FIG. 3A.

FIG. 3A illustrates a cross-sectional view of a perpendicular spin orbit torque memory device 300 having a tungsten insertion layer 303 within free magnetic material layer 112 and FIG. 3B illustrates a top-down view of perpendicular spin orbit torque memory device 300, arranged in accordance with at least some implementations of the present disclosure. As shown, the cross-sectional view of FIG. 3A is taken along the C-C plane of the top-down view of FIG. 3B such that the view of FIG. 3A is along the x-z plane. Herein, like materials and components are labeled with like reference numerals. Notably, with respect to pSOT memory device 100, perpendicular spin orbit torque (pSOT) memory device 300, includes a tungsten insertion layer 303 between SOT electrode layer 102 and free magnetic material layer 112 and is absent over SOT electrode layer 102 external to free magnetic material layer 112. Like components of pSOT memory device 300 may have any characteristics (e.g., materials, dimensions, etc.) as discussed with respect to any pSOT memory device discussed herein such as pSOT memory devices 100, 200.

As shown in FIG. 3A, tungsten insertion layer 303 is on SOT electrode layer 102 and is between SOT electrode layer 102 and free magnetic material layer 112 and is absent over SOT electrode layer 102 external to free magnetic material layer 112. As illustrated, in an embodiment, tungsten insertion layer 303 is entirely within the sidewall dimensions of free magnetic material layer 112. In some embodiments, tungsten insertion layer 303 extends beyond the sidewall dimensions of free magnetic material layer 112 by any distance such as 1 to 5 nm. In such embodiments, tungsten insertion layer 303 is between SOT electrode layer 102 and free magnetic material layer 112 and absent over SOT electrode layer 102 external to free magnetic material layer 112. As shown, exposed regions 304 extend to an outer edge of SOT electrode layer 102.

Tungsten insertion layer 303 is predominantly tungsten as discussed herein with respect to tungsten insertion layer 103. In some embodiments, tungsten insertion layer 303 is pure or nearly pure tungsten. In an embodiment, tungsten insertion layer 303 is not less than 95% tungsten by weight. In an embodiment, tungsten insertion layer 303 is not less than 99% tungsten by weight. In an embodiment, tungsten insertion layer 303 is not less than 99.9% tungsten by weight. In some embodiments, tungsten insertion layer 303 is notable in that it is absent of tantalum such that it provides a tantalum free thicknesses, a, between SOT electrode layer 102 and free magnetic material layer 112

As shown, tungsten insertion layer 303 is between SOT electrode layer 102 and free magnetic material layer 112 and is absent from exposed regions 304 of SOT electrode layer 102. As discussed, in an embodiment, tungsten insertion layer 303 is between SOT electrode layer 102 and free magnetic material layer 112 such that tungsten insertion layer 303 is laterally within the sidewall dimensions of free magnetic material layer 112. In other embodiments, tungsten insertion layer 303 extends laterally beyond the sidewall dimensions of free magnetic material layer 112. As shown with respect to FIG. 3B, SOT electrode layer 102 is exposed from free magnetic material layer 112 and material stack 124 (of which only the top of terminal electrode layer 120 is illustrated) in regions 304 outside of tungsten insertion layer 303.

Film thickness, a, of tungsten insertion layer 303 may be any film thickness discussed with respect to thickness, a, as described with respect to tungsten insertion layer 103. In an embodiment, tungsten insertion layer 303 has a thickness of not less than 0.05 nm. As discussed, a thickness of not less than 0.05 nm between SOT electrode layer 102 and free magnetic material layer 112 may stop or diminish diffusion of boron from free magnetic material layer 112 into SOT electrode layer 102 for improved PMA and thermal stability. In an embodiment, tungsten insertion layer 303 has a thickness of not more than 1 nm. In an embodiment, tungsten insertion layer 303 has a thickness of not more than 2 nm. In an embodiment, tungsten insertion layer 303 has a thickness in the range of 0.05 to 5 nm (e.g., not less than 0.05 nm and not more than 5 nm). In an embodiment, tungsten insertion layer 303 has a thickness in the range of 0.05 to 2 nm (e.g., not less than 0.05 nm and not more than 2 nm). In an embodiment, tungsten insertion layer 303 has a thickness of about 2 nm (e.g., not less than 1 nm and not more than 3 nm). In an embodiment, tungsten insertion layer 303 has a thickness of about 1 nm (e.g., not less than 0.05 nm and not more than 1.5 nm). In an embodiment, tungsten insertion layer 303 has a thickness of not less than 0.05 nm and not more than 0.8 nm. In an embodiment, tungsten insertion layer 303 has a thickness of not less than 0.05 nm and not more than 1 nm. In an embodiment, tungsten insertion layer 303 has a thickness of not less than 0.05 nm and not more than 1.5 nm. In an embodiment, tungsten insertion layer 303 is not less than 99% tungsten by weight and has a film thickness of not less than 0.05 nm. In an embodiment, tungsten insertion layer 303 is not less than 99% tungsten by weight and has a film thickness of not less than 0.05 nm and not more than 2 nm. In an embodiment, tungsten insertion layer 303 is not less than 99% tungsten by weight and has a film thickness of not less than 0.05 nm and not more than 1.5 nm. In an embodiment, tungsten insertion layer 303 has a thickness of about 3 nm (e.g., not less than 2.8 nm and not more than 3.2 nm). In an embodiment, tungsten insertion layer 303 has a thickness of not less than 0.05 nm and not more than 1 nm.

Figure 4A:
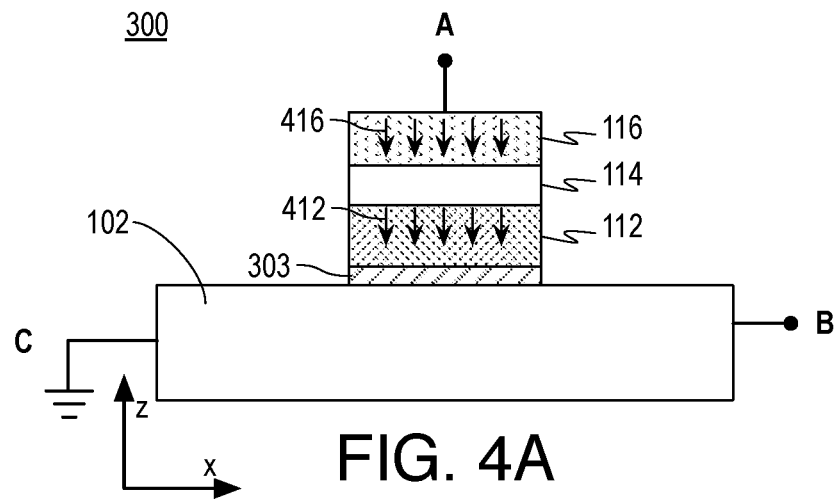
FIGS. 4A, 4B, and 4C illustrate a mechanism for switching a perpendicular spin orbit torque memory device.
Figure 4B:
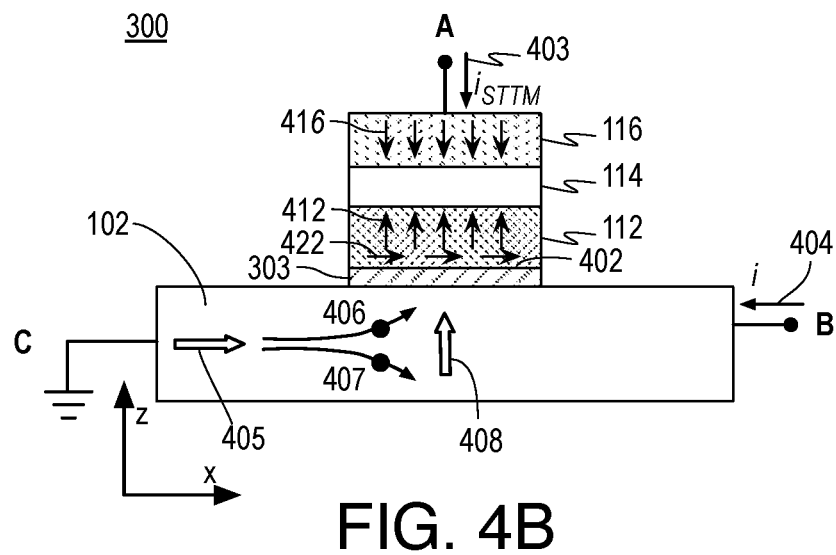
Figure 4C:
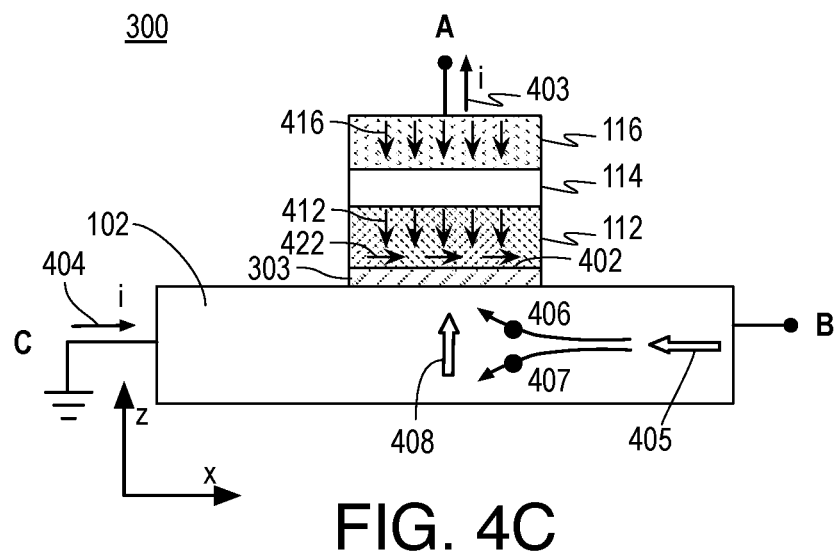

FIGS. 4A, 4B, and 4C illustrate a mechanism for switching a perpendicular spin orbit torque memory device, arranged in accordance with at least some implementations of the present disclosure. FIGS. 4A-4C are illustrated with pSOT memory device 300 with SOT electrode layer 102 expanded in the z-dimension and with substrate 150, optional SAF layer 118, and electrode layer 120 removed for the sake of clarity or presentation. However, the switching mechanisms discussed with respect to FIGS. 4A-4C may be implemented with any pSOT memory device discussed herein such as pSOT memory device 100 or pSOT memory device 200. As shown, pSOT memory device 300 includes SOT electrode layer 102, tungsten insertion layer 303, free magnetic material layer 112, tunnel barrier layer 114, and fixed magnetic material layer 116.

As shown in FIG. 4A, a magnetization 412 of free magnetic material layer 112 is aligned and in a direction parallel to a magnetization 416 of fixed magnetic material layer 116 such that both magnetization 412 and magnetization 416 are in the negative z-direction. In another embodiment, both magnetization 412 and magnetization 416 are in the positive z-direction. As discussed, when magnetization 412 of free magnetic material layer 112 is aligned and in a direction parallel to a magnetization 416 of fixed magnetic material layer 116, pSOT memory device 300 is in a low resistance state.

FIG. 4B illustrates pSOT memory device 300 being switched to a high resistance state from the low resistance state of FIG. 4A. In an embodiment, a reversal in the direction of magnetization 412 of free magnetic material layer 112 in FIG. 4B relative to the direction of magnetization 412 of free magnetic material layer 112 in FIG. 4A is caused by inducing a polarized spin diffusion current 408, in the z-direction, in SOT electrode layer 102 and, optionally, through assistance from an exchange bias 422, in the x-direction in free magnetic material layer 112 at or near an interface 402 between tungsten insertion layer 303 and free magnetic material layer 112. In some embodiments, a polarized spin diffusion current similar to polarized spin diffusion current 408 is also provided by tungsten insertion layer 303. In some embodiments, a current 403 (e.g., a spin transfer torque current, $i_{STTM}$) may also be provided through pSOT memory device 300.

In an embodiment, a charge current 404 (e.g., i) is passed through SOT electrode layer 102 in the negative x-direction by applying a positive voltage at terminal B with respect to ground terminal C. In response to charge current 404, an electron current 405 flows in the positive x-direction. Electron current 405 includes electrons with two opposing spin orientations, a type I electrons 406, having a spin oriented in the y-direction and a type II electrons 407 having a spin oriented in the negative y-direction. In an embodiment, electrons constituting electron current 405 experience a spin dependent scattering phenomenon in SOT electrode layer 102 brought about by a spin-orbit interaction between the nucleus of the atoms in SOT electrode layer 102 and the electrons in electron current 405. The spin dependent scattering phenomenon causes type I electrons 406, with spins oriented in the y-direction (e.g., into the page of FIG. 4B), to be deflected upwards or in the z-direction towards free magnetic material layer 112 and type II electrons 407, with spins oriented in the negative y-direction (e.g., out of the page of FIG. 4B), to be deflected downwards or in the negative z-direction away free magnetic material layer 112 (and towards substrate 150, not shown). The separation of type I electrons 406 and type II electrons 407 induces a polarized spin diffusion current 408 in SOT electrode layer 102 (and optionally in tungsten insertion layer 303, tungsten insertion layer 203, tungsten insertion layer 103). In an embodiment, polarized spin diffusion current 408 is diffused upwards or in the z-direction towards free magnetic material layer 112, which induces a Spin Hall torque on magnetization 412 of free magnetic material layer 112. Optionally, a torque may be exerted on magnetization 412 of free magnetic material layer 112 by exchange bias 422 in the x-direction. The Spin Hall torque or the combination of the Spin Hall torque and torque from exchange bias 422 switches magnetization 412 of free magnetic material layer 112 (e.g., to a positive Z-direction) as illustrated.

Such phenomena may also occur in tungsten insertion layer 303 to generate a polarized spin diffusion current similar to polarized spin diffusion current 408. Furthermore, in implementation of pSOT memory devices 100, 200 such polarized spin diffusion current from tungsten insertion layers 103, 203 may be more pronounced.

As discussed above, in some embodiments, an $i_{STTM}$ current 403 is be passed through pSOT memory device 300 in the negative Z-direction (by applying a positive voltage at terminal A with respect to ground terminal C). For example, $i_{STTM}$ current 403, flowing through pSOT memory device 300 exerts torque on the magnetization 412 of free magnetic material layer 112. Such a spin transfer torque may assist flipping of magnetization 412 in free magnetic material layer 112 from the negative z-direction to the positive z-direction.

As discussed, when magnetization 412 of free magnetic material layer 112 is misaligned and in a direction parallel to a magnetization 416 of fixed magnetic material layer 116, pSOT memory device 300 is in a high resistance state. For example, pSOT memory device 300 is in a high resistance state when magnetization 412 is in a positive z-direction and magnetization 416 is in a negative z-direction or vice versa.

FIG. 4C illustrates pSOT memory device 300 being switched to a low resistance state from the high resistance state of FIG. 4B. In an embodiment, a reversal in the direction of magnetization 412 of free magnetic material layer 112 from the positive z-direction to the negative z-direction is brought about by a reversal in the direction of spin diffusion current 408 in SOT electrode layer 102 and, optionally, by torque from exchange bias 422 in the x-direction. In some embodiments, current 403 (e.g., $i_{STTM}$) may also be provided through pSOT memory device 300.

For example, as discussed with respect to FIG. 4B, charge current 404 (e.g., i) is passed through SOT electrode layer 102 in the positive x-direction by applying a negative voltage at terminal B with respect to ground terminal C. In response thereto, electron current 405 flows in the negative x-direction and includes type I electrons 406 type II electrons 407 that experience spin dependent scattering phenomenon in SOT electrode layer 102, as discussed, which causes polarized spin diffusion current 408 in SOT electrode layer 102 (and optionally in tungsten insertion layer 303, tungsten insertion layer 203, tungsten insertion layer 103). In an embodiment, polarized spin diffusion current 408 is diffused upwards or in the z-direction towards free magnetic material layer 112, which induces a Spin Hall torque on magnetization 412 of free magnetic material layer 112. Optionally, a torque may be exerted on magnetization 412 of free magnetic material layer 112 by exchange bias 422 in the x-direction. The Spin Hall torque or the combination of the Spin Hall torque and torque from exchange bias 422 switches magnetization 412 of free magnetic material layer 112 (e.g., to a negative Z-direction) as illustrated in FIG. 4C.

Thereby, pSOT memory device 300 is switched between a low resistance state (when magnetization 412 is aligned and in a direction parallel to a magnetization 416) and a high resistance state (when magnetization 412 is misaligned and in a direction parallel to a magnetization 416). Such resistance states may be detected by sense circuitry. Since the free magnetic layer does not need power to retain the relative orientation of magnetization, pSTTM is non-volatile memory.

Figure 5:
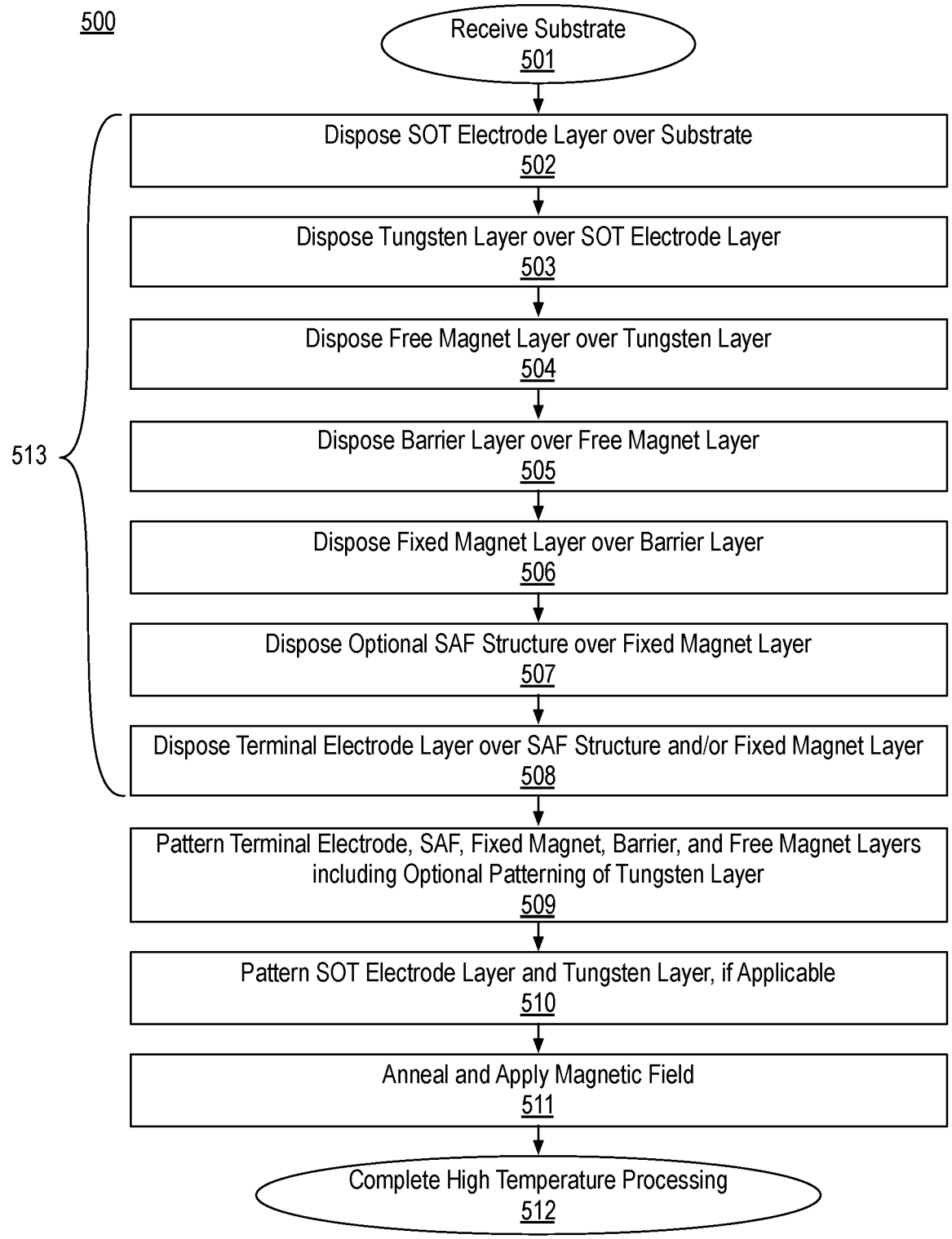
FIG. 5 illustrates a flow diagram of an example process for fabricating perpendicular spin orbit torque memory device structures.

FIG. 5 illustrates a flow diagram of an example process 500 for fabricating perpendicular spin orbit torque memory device structures, arranged in accordance with at least some implementations of the present disclosure. For example, process 500 may be implemented to fabricate any of pSOT memory devices 100, 200, 300 as discussed herein and/or memory devices including such pSOT memory devices. In the illustrated implementation, process 500 may include one or more operations as illustrated by operations 501-512. However, embodiments herein may include additional operations, certain operations being omitted, or operations being performed out of the order provided. In an embodiment, process 500 is used to fabricate perpendicular spin orbit torque memory device structure over substrate 150 as discussed further herein with respect to FIGS. 6A-6G.

Process 500 begins at operation 501, where a substrate may be received for processing. The substrate may include any suitable substrate such as a silicon wafer or the like. For example, the substrate may include any substrate and/or devices discussed with respect to substrate 150. In some embodiments, the substrate includes underlying devices such as transistors and/or electrical interconnects or the like. In an embodiment, substrate 150 including a conductive interconnect 601 is received and processed as discussed with respect to FIGS. 6A-6G.

Processing may continue at operations 502-508, which may be characterized collectively as disposition or deposition operations 513. At each of operations 502-508, the indicated layer(s) (an SOT electrode layer at operation 502, a predominantly tungsten layer at operation 503, a free magnetic material layer at operation 504, a tunnel barrier layer at operation 505, a fixed magnetic material layer at operation 506, an optional SAF layer at operation 507, and a terminal electrode layer at operation 508) are disposed over or on the layer or layers disposed at the previous operation (or over the received substrate for the SOT electrode layer disposed at operation 502).

Each of the indicated layers may be disposed using any suitable technique or techniques such as deposition techniques. In an embodiment, one, some or all of the layers are deposited using physical vapor deposition (sputter deposition) techniques. As will be appreciated, such layers may be deposited on the layer disposed at the previous operation (or on the received substrate for the SOT electrode layer disposed at operation 502) or an intervening layer or layers may be between the layer being disposed at the current operation and the layer disposed at the previous operation. Furthermore, some of the layers are optional in some embodiments and such layer(s) may be omitted. In an embodiment, the layers disposed at operations 513 are deposited in situ (e.g., in place without being moved or altered between operations) without exposing the layers to an atmospheric environment between such depositions. For example, the layers disposed at operations 513 may be deposited using sequential in situ physical vapor depositions.

For example, at operation 502, an SOT electrode layer is disposed on or over the substrate received at operation 501 using any suitable technique or techniques such as deposition techniques (e.g., physical vapor deposition). The terminal electrode layer may have any characteristics discussed herein with respect to SOT electrode layer 102. For example, the terminal electrode may include one or more of Pt, Hf, HfO, Co, or IrMn deposited at a thickness in the range of 2 to 10 nm.

At operation 503, a tungsten insertion layer is disposed on the SOT electrode layer using any suitable technique or techniques such as deposition techniques (e.g., physical vapor deposition). The tungsten insertion layer may have any characteristics discussed herein with respect to tungsten insertion layer 103. For example, the tungsten insertion layer may be pure or nearly pure tungsten (e.g., not less than 95% by weight, not less than 99% by weight, or not less than 99% by weight) deposited at any thickness discussed with respect to film thickness, a.

At operation 504, a free magnetic material layer is disposed on the tungsten insertion layer using any suitable technique or techniques such as deposition techniques (e.g., physical vapor deposition). The free magnetic material layer may have any characteristics discussed herein with respect to free magnetic material layer 112. In an embodiment, depositing the free magnetic material layer includes depositing a layer of amorphous CoFeB on the tungsten insertion layer. However, any suitable material discussed with respect to free magnetic material layer 112 may be disposed on the tungsten insertion layer. At operation 505, a tunnel barrier layer is disposed on or over the free magnet layer using any suitable technique or techniques such as deposition techniques (e.g., physical vapor deposition). The tunnel barrier layer may have any characteristics discussed herein with respect to tunnel barrier layer 114. In an embodiment, depositing the tunnel barrier layer includes depositing a layer of dielectric material over or on the free magnetic material layer (e.g., amorphous CoFeB). In an embodiment, depositing the tunnel barrier layer includes depositing a layer of MgO. In some embodiments, the tunnel barrier layer may be omitted. At operation 506, a fixed magnetic material layer is disposed on or over the tunnel barrier layer or on or over the free magnetic material layer using any suitable technique or techniques such as deposition techniques (e.g., physical vapor deposition). The fixed magnetic material layer may have any characteristics discussed herein with respect to fixed magnetic material layer 116. In an embodiment, depositing the fixed magnetic material layer includes depositing a layer of amorphous CoFeB over the tunnel barrier layer (e.g., the dielectric material layer). For example, the discussed amorphous CoFeB free and fixed magnetic material layers may be later annealed to covert them to polycrystalline CoFeB.

At operation 502, optional SAF structure layers (e.g., a first magnetic layer, a non-magnetic layer, and a second magnetic layer) may be disposed on or over the fixed magnetic material layer using any suitable technique or techniques such as deposition techniques (e.g., physical vapor deposition). The SAF structure layers may have any characteristics discussed herein with respect to synthetic antiferromagnetic layer 118. At operation 508, a terminal electrode layer is disposed on or over the SAF structure layers or on or over the fixed magnetic material layer using any suitable technique or techniques such as deposition techniques (e.g., physical vapor deposition). The terminal electrode layer may have any characteristics discussed herein with respect to electrode layer 120.

Processing continues from operations 513 at operation 509 where the layers deposited at operations 513 are patterned. As discussed, in some embodiments, one or more of the layers illustrated in operations 513 may be skipped. The layers received at operation 509 are patterned using any suitable technique or techniques such as photolithography operations or the like. In an embodiment, a photoresist pattern is provided, the terminal electrode layer disposed at operation 508 and the patterned terminal electrode layer is used as a hard mask to pattern the underlying layers. Operation 509 generate patterned layers including a patterned terminal electrode layer, a patterned SAF layer (if implemented), a patterned fixed magnetic material layer, a patterned tunnel barrier layer (if implemented), and a patterned free magnetic material layer. For example, such patterning may include etch operations.

In some embodiments, such patterning does not pattern or does not significantly pattern the underlying predominantly tungsten layer. Such embodiments provide pSOT memory device 100 as discussed herein. In some embodiments, such patterning does pattern (e.g., via etch) an exposed portion of the predominantly tungsten layer. The patterning thereby provides the predominantly tungsten layer with a first film thickness between the SOT electrode layer and the free magnetic material layer and a second film thickness less than the first film thickness over the SOT electrode layer and external to the free magnetic material layer. Such embodiments provide pSOT memory device 200 as discussed herein. In other embodiments, the patterning patterns and removes (e.g., via etch) the exposed portion of the predominantly tungsten layer. The patterning thereby removes the exposed portion and provides the predominantly tungsten layer between the first electrode layer and the free magnetic material layer and absent over the first electrode layer external to the patterned free magnetic material layer. Such embodiments provide pSOT memory device 300 as discussed herein.

Processing continues at operation 510, where the predominantly tungsten layer (if present) and the SOT electrode layer are patterned. The layers received at operation 510 are patterned using any suitable technique or techniques such as photolithography operations or the like. In an embodiment, a photoresist pattern is provided and the underlying layers are patterned using etch techniques. For example, the predominantly tungsten layer (if present) and the SOT electrode layer are patterned to provide a profile in the x-y plane (e.g., rectangular) for an electrode structure such that the material stack patterned at operation 509 is on the patterned profile.

Processing continues at operation 511, where the patterned layers are annealed and a magnetic field may be applied, as needed, to the patterned layers to generate a magnetic junction device structure. Such annealing is performed at any suitable temperature(s) and duration(s) to set the crystalline structure of the barrier layer and the patterned fixed and free magnetic material layers and/or to drive boron from one or more of the patterned fixed and free magnetic material layers. In an embodiment, the annealing converts amorphous CoFeB magnetic material layers to polycrystalline CoFeB. In an embodiment, the anneal operation(s) have a maximum temperature in the range of about 350 to 400° C. Furthermore, the applied magnetic field is applied at any suitable field strength such as 1 to 5 Teslas for any suitable duration. Such magnetic field application may establish the magnetism of one or more layers of the free magnetic material layer(s) or the fixed magnetic material layer(s). The anneal and magnetic field application may be performed separately or at least partially simultaneously. Furthermore, in some embodiments, such anneal processing is implemented after (e.g., immediately after) after disposing (e.g., via deposition) of the terminal electrode layer, as discussed with respect to operation 508, and prior to patterning as discussed with respect to operations 509, 510. Such anneal processing after disposing the terminal electrode layer may achieve the above discussed crystallinity prior to patterning.

Processing continues and completes at operation 512, where high temperature pSOT device and/or metal-oxide-semiconductor (MOS) transistor integrated circuit (IC) processing is performed, for example, at a temperature of at least 400° C. or, in some embodiments, greater than 400° C. Any standard microelectronic fabrication processes such as lithography, etch, thin film deposition, planarization (e.g., CMP), and the like may be performed to complete interconnection of a pSOT device implementing any tungsten insertion layer discussed herein such as tungsten insertion layers 103, 203, 303. For example, contacts may be provided on the terminal electrode and the electrode structure (e.g., the predominantly tungsten layer, if present, or the SOT electrode layer).

Figure 6A:
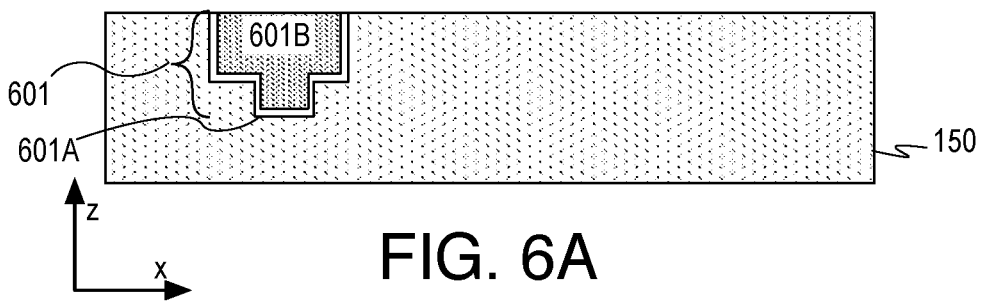
FIGS. 6A, 6B, 6C, 6D, 6E, 6F, and 6G illustrate side views of example perpendicular spin orbit torque memory device structures as particular fabrication operations are performed.

FIGS. 6A, 6B, 6C, 6D, 6E, 6F, and 6G illustrate side views of example perpendicular spin orbit torque memory device structures as particular fabrication operations are performed, arranged in accordance with at least some implementations of the present disclosure. As shown in FIG. 6A, perpendicular spin orbit torque memory device structure 600 includes substrate 150. For example, substrate 150 may be any substrate such as any substrate discussed herein such as a substrate wafer. In some embodiments, substrate 150 is or includes a semiconductor material such as monocrystalline silicon substrate, a silicon on insulator, etc. As shown, in an embodiment, substrate 150 includes a conductive interconnect 601 including a barrier layer 601A such as tantalum nitride and a fill metal 601B such as copper, tungsten or ruthenium. In an embodiment, conductive interconnect 601 is fabricated using a damascene or a dual damascene process. Conductive interconnect 601 may be surrounded by a dielectric layer or material. In an embodiment, conductive interconnect 601 is to make electrical contact with an electrode structure as illustrated herein.

Figure 6B:
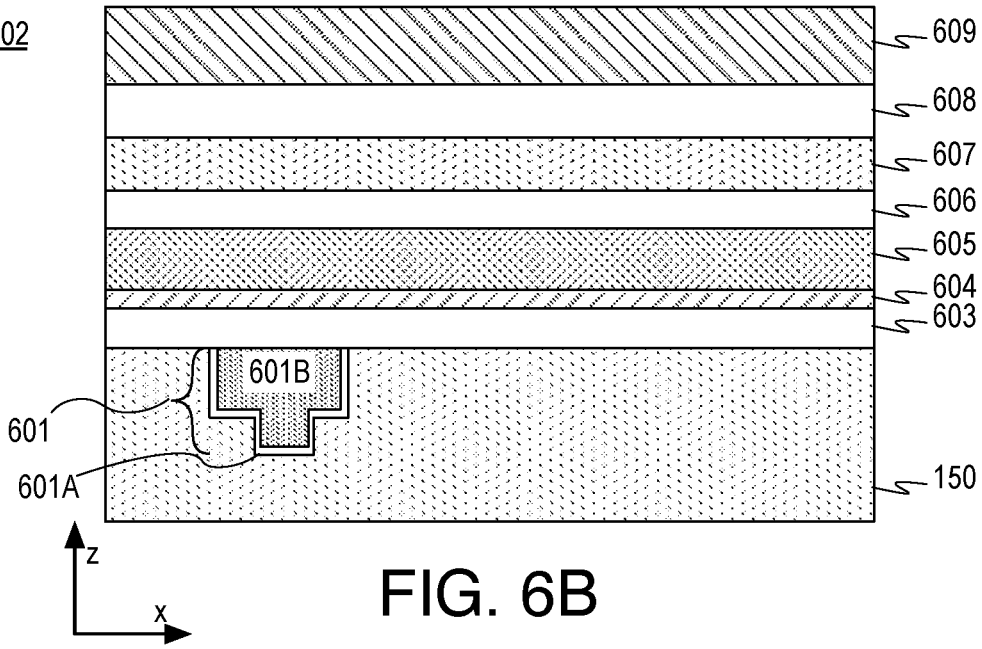

FIG. 6B illustrates a perpendicular spin orbit torque memory device structure 602 similar to perpendicular spin orbit torque memory device structure 600, after the disposition of an SOT electrode layer 603, a tungsten insertion layer 604, a free magnetic material layer 605 (e.g., an amorphous CoFeB), a tunnel barrier layer 606, a fixed magnetic material layer 607 (e.g., an amorphous CoFeB), an optional SAF layer 608, and a terminal electrode layer 609. The illustrated layers are formed using any suitable technique or techniques such as deposition techniques including physical vapor deposition or any other operations discussed with respect to operations 513 or elsewhere herein. As shown, the illustrated layers may be formed in a bulk manner over substrate 150 and in a horizontal manner (e.g., along the x-y plane of substrate 101). As discussed, SAF layer 608 and/or tunnel barrier layer 606 are optional and may not be disposed in some embodiments. In an embodiment, fixed magnetic material layer 607 is disposed on free magnetic material layer 605. In an embodiment, terminal electrode layer 609 is disposed on fixed magnetic material layer 607.

Figure 6C:
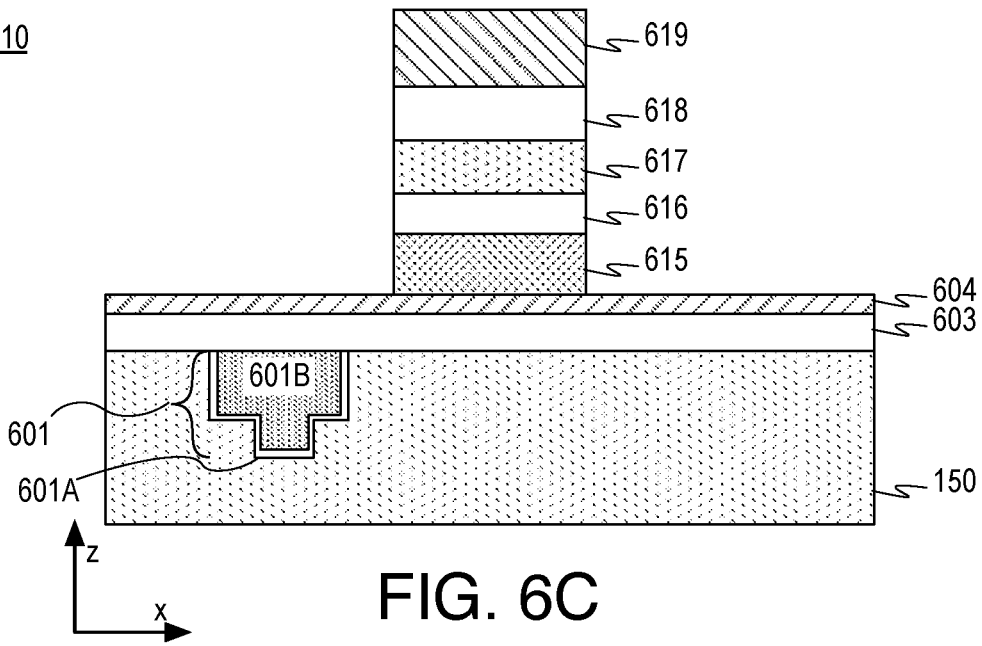

FIG. 6C illustrates a perpendicular spin orbit torque memory device structure 610 similar to perpendicular spin orbit torque memory device structure 602, after the patterning of free magnetic material layer 605, tunnel barrier layer 606, fixed magnetic material layer 607, SAF layer 608, and terminal electrode layer 609 to provide or form a patterned free magnetic material layer 615, a patterned tunnel barrier layer 616, a patterned fixed magnetic material layer 617, a patterned SAF layer 618, and a patterned terminal electrode layer 619. In an embodiment, photolithography techniques are used to provide a patterned resist layer over terminal electrode layer 609 and etch techniques may be used to pattern the illustrated layers. In an embodiment, the pattern of the resist layer is transferred to terminal electrode layer 609 as patterned terminal electrode layer 619, which is then used as a hardmask to pattern the other layers. For example, terminal electrode layer 609 and/or patterned terminal electrode layer 619 may be characterized as a hardmask layer. As shown in FIG. 6C, in some embodiments, tungsten insertion layer 604 is not patterned or etched (or is not significantly patterned or etched). In such embodiments, pSOT memory device 100 may be fabricated.

Figure 6D:
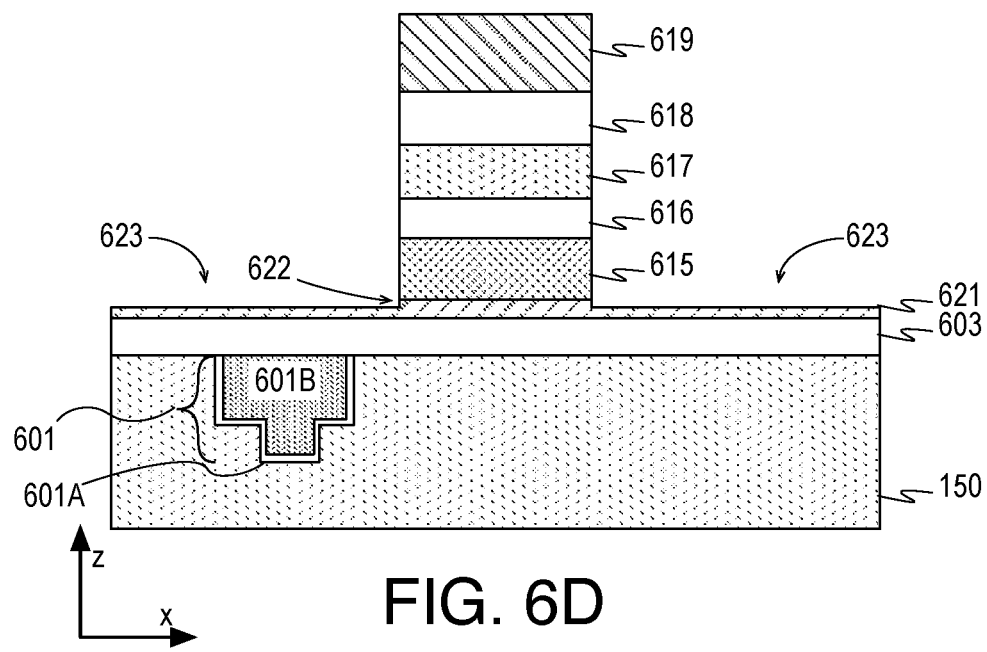

FIG. 6D illustrates a perpendicular spin orbit torque memory device structure 620 similar to perpendicular spin orbit torque memory device structure 602, after the patterning of free magnetic material layer 605, tunnel barrier layer 606, fixed magnetic material layer 607, SAF layer 608, and terminal electrode layer 609 to provide or form patterned free magnetic material layer 615, patterned tunnel barrier layer 616, patterned fixed magnetic material layer 617, patterned SAF layer 618, and patterned terminal electrode layer 619 as discussed with respect to FIG. 6C and, further, after patterning (e.g., etching) of tungsten insertion layer 604 to form a patterned tungsten insertion layer 621. As shown, patterned tungsten insertion layer 621 includes a portion 622 and a portion or portions 623 having any characteristics discussed with respect to a portion 213 and a portion 223 of tungsten insertion layer 203. Notably, portion 622, having a first film thickness, is between patterned free magnetic material layer 615 and SOT electrode layer 603 and portion 623, having a second film thickness that is less than the first film thickness, is over SOT electrode layer 603 and external to patterned free magnetic material layer 615. For example, perpendicular spin orbit torque memory device 620 may be used to fabricate pSOT memory device 200.

Figure 6E:
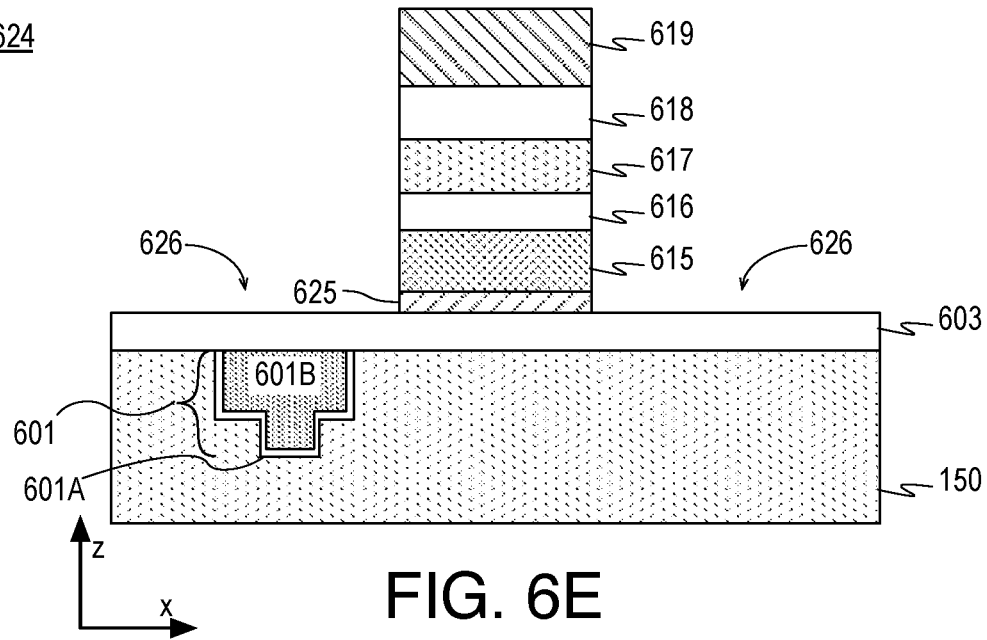

FIG. 6E illustrates a perpendicular spin orbit torque memory device structure 624 similar to perpendicular spin orbit torque memory device structure 602, after the patterning of free magnetic material layer 605, tunnel barrier layer 606, fixed magnetic material layer 607, SAF layer 608, and terminal electrode layer 609 to provide or form patterned free magnetic material layer 615, patterned tunnel barrier layer 616, patterned fixed magnetic material layer 617, patterned SAF layer 618, and patterned terminal electrode layer 619 as discussed with respect to FIG. 6C and, further, after patterning (e.g., etching) of tungsten insertion layer 604 to form a patterned tungsten insertion layer 625. As shown, patterned tungsten insertion layer 625 is between patterned free magnetic material layer 615 and SOT electrode layer 603 and leaves portions 626 of SOT electrode layer 603 external to patterned free magnetic material layer 615 exposed such that tungsten insertion layer 625 is absent therefrom. For example, perpendicular spin orbit torque memory device 624 may be used to fabricate pSOT memory device 300.

Figure 6F:
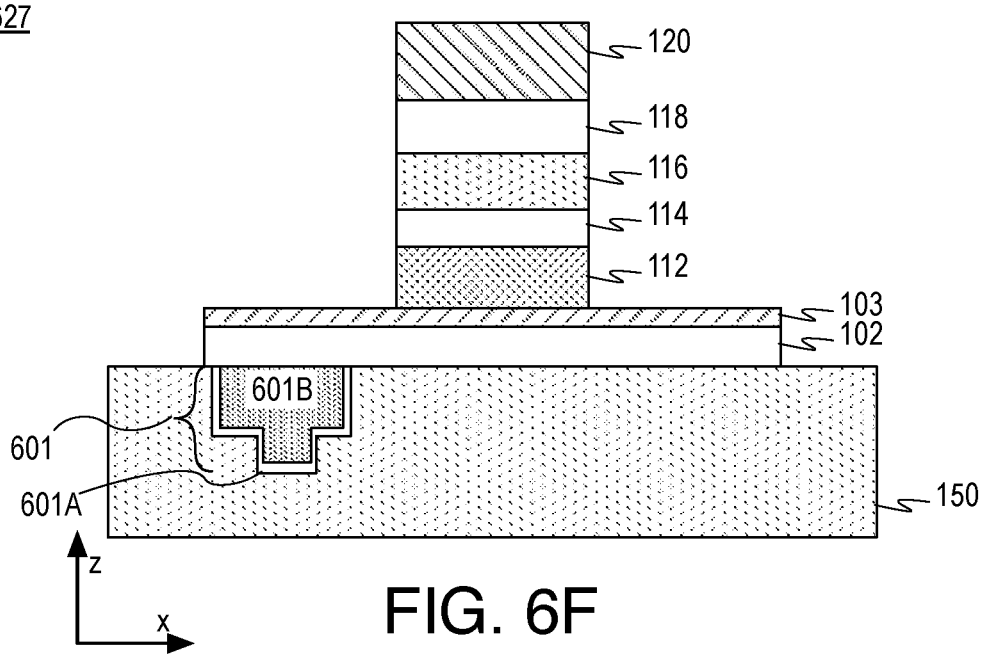

FIG. 6F illustrates a perpendicular spin orbit torque memory device structure 627 similar to perpendicular spin orbit torque memory device structure 610, after the patterning of tungsten insertion layer 604 and SOT electrode layer 603 and after one or more annealing operations and the optional application of a magnetic field to provide SOT electrode layer 102, tungsten insertion layer 103, free magnetic material layer 112, tunnel barrier layer 114, fixed magnetic material layer 116, synthetic antiferromagnetic (SAF) layer 118, and electrode layer 120. Notably, perpendicular spin orbit torque memory device structure 627 has the same components as pSOT memory device 100.

The patterning of tungsten insertion layer 604 and SOT electrode layer 603 may be performed using any suitable technique or techniques. In an embodiment, photolithography techniques are used to provide a patterned resist layer over tungsten insertion layer 604 and SOT electrode layer 603 (and the material stack including patterned free magnetic material layer 615, patterned tunnel barrier layer 616, patterned fixed magnetic material layer 617, patterned SAF layer 618, and patterned terminal electrode layer 619) and etch techniques may be used to pattern tungsten insertion layer 604 and SOT electrode layer 603.

The discussed annealing operation(s) are performed at any suitable temperature(s) and duration(s). In an embodiment, the anneal operation(s) have a maximum temperature in the range of 350 to 400° C. Such annealing operation(s) may crystallize MgO in tunnel barrier layer 114 and/or match the crystalline structure of tunnel barrier layer 114 to adjoining CoFeB magnetic material layers and/or drive boron from one or more of fixed magnetic material layer 116 and free magnetic material layer 112. Furthermore, the applied magnetic field is at any suitable field strength such as 1 to 5 Teslas for any suitable duration. Such magnetic field application establishes the magnetism of one or more layers of fixed magnetic material layer 116 and free magnetic material layer 112. In an embodiment, the annealing and magnetic field application may be performed at least partially simultaneously such that the annealing is performed in the presence of a 1 to 5 Tesla magnetic field. For example, the annealing duration and the magnetic field application durations may at least partially overlap. In other embodiments, the annealing and magnetic field application may be performed separately.

The discussed patterning, annealing, and application of magnetic field illustrated and discussed with respect to FIG. 6F may be applied to perpendicular spin orbit torque memory device structure 620 to generate a perpendicular spin orbit torque memory device structure analogous to pSOT memory device 100 or to perpendicular spin orbit torque memory device structure 624 to generate a perpendicular spin orbit torque memory device structure analogous to pSOT memory device 200. In the embodiment of perpendicular spin orbit torque memory device structure 620, patterned tungsten insertion layer 621 and SOT electrode layer 603 are patterned to form tungsten insertion layer 203 and SOT electrode layer 102. In the embodiment of perpendicular spin orbit torque memory device structure 624, SOT electrode layer 603 is patterned to form SOT electrode layer 102.

Figure 6G:
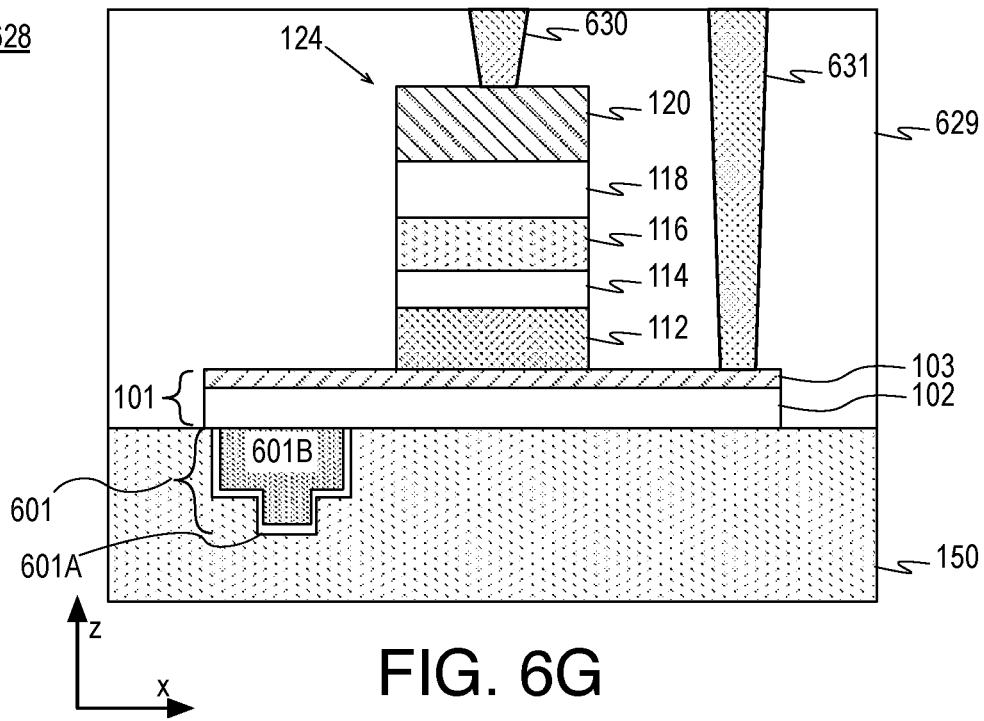

FIG. 6G illustrates a perpendicular spin orbit torque memory device structure 628 similar to perpendicular spin orbit torque memory device structure 627, after the formation of contacts 630, 631 within a dielectric layer 629. As shown, contact 630 provides electrical contact and coupling to electrode layer 120 and contact 631 provides electrical contact and coupling to electrode structure 101 via tungsten insertion layer 103. In other embodiments, contact 631 provides electrical contact and coupling to electrode structure 201 via tungsten insertion layer 203 or to electrode structure 301 via SOT electrode layer 102. As shown, three terminals are provided in perpendicular spin orbit torque memory device structure 628 via contact 630, contact 631, and conductive interconnect 601. In another embodiment, conductive interconnect 601 is not provided and a third terminal is provided via another contact to electrode structure 101 opposite material stack 124 with respect to contact 631. Contacts 630, 631 and dielectric layer 629 may be formed using any suitable technique or techniques. In an embodiment, a bulk dielectric layer is applied and patterned using photolithography techniques and the patterned openings are filled using metal deposition techniques to form contacts 630, 631 and dielectric layer 629. In an embodiment, after metal fill a planarization technique is performed.

Figure 7:
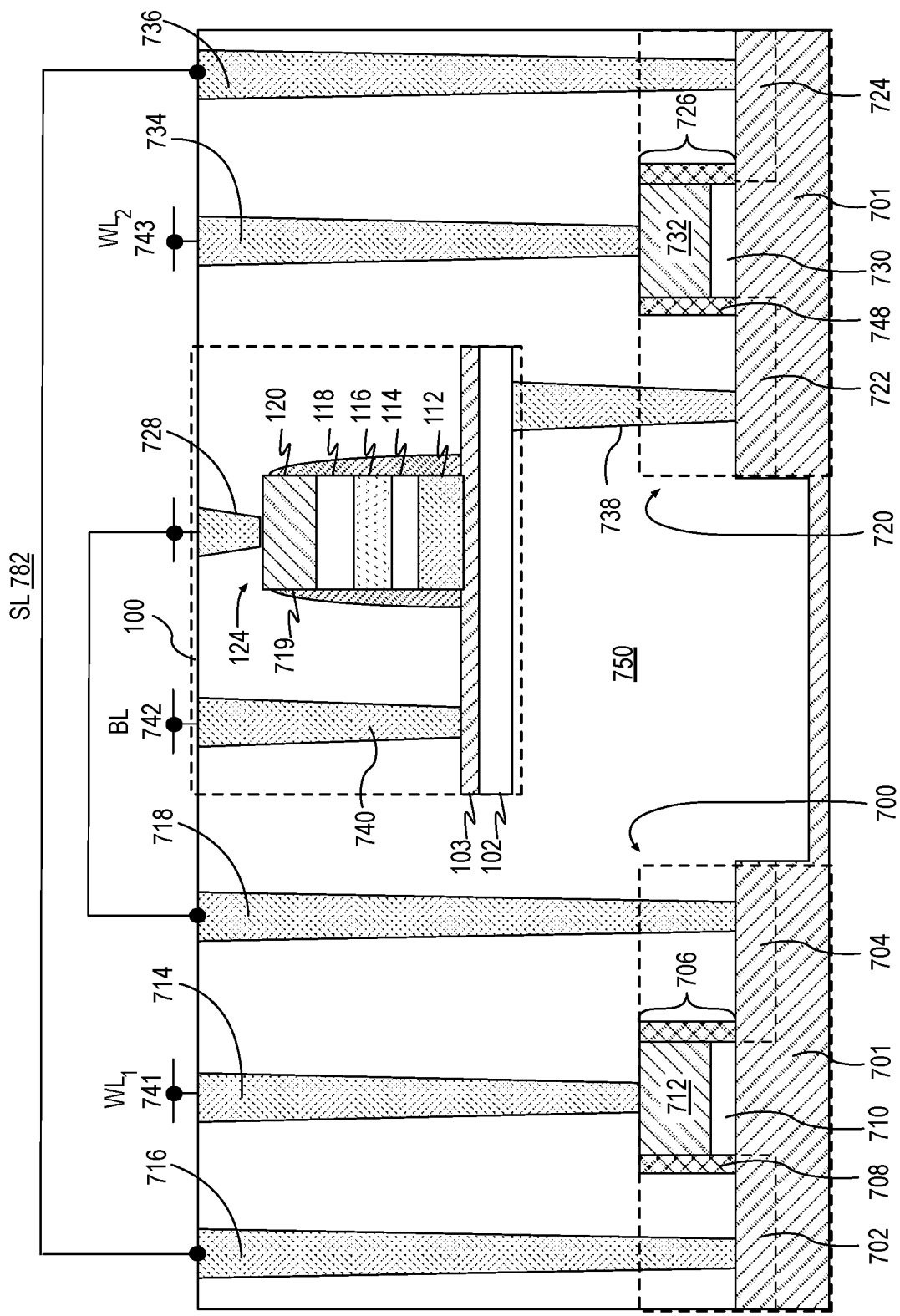
FIG. 7 illustrates an exemplary perpendicular spin orbit torque memory device integrated into a memory architecture.

FIG. 7 illustrates an exemplary perpendicular spin orbit torque (pSOT) memory device 100 integrated into a memory architecture, arranged in accordance with at least some implementations of the present disclosure. Although illustrated with respect to perpendicular spin orbit torque (pSOT) memory device 100, any perpendicular spin orbit torque memory device discussed herein, such as perpendicular spin orbit torque memory device 200 or perpendicular spin orbit torque memory device 300 may be implemented within the architecture illustrated with respect to FIG. 7. A shown, pSOT memory device 100 has a first terminal coupled with a first transistor 700, a second terminal coupled with a second transistor 720, and a third terminal coupled with a bit line 742. In an embodiment, the first transistor 700 and second transistor 720 are over and/or within a substrate 701.

In an embodiment, first transistor 700 and second transistor 720 are metal-oxide-semiconductor field-effect transistors (MOSFET or simply MOS transistors) fabricated on and/or within substrate 701. In various implementations, first transistor 700 and second transistor 720 may be planar transistors, non-planar transistors, or a combination thereof. Non-planar transistors include FinFET transistors such as double-gate transistors and tri-gate transistors as well as wrap-around or all-around gate transistors such as nanoribbon and nanowire transistors. In an embodiment, first transistor 700 and second transistor 720 are tri-gate transistors horizontally disposed on a same plane as illustrated in FIG. 7. First transistor 700 and second transistor 720 are electrically isolated by a dielectric layer 750 although they are formed on a common substrate 701.

In an embodiment, first transistor 700 has a source region 702, a drain region 704 and a gate 706. First transistor 700 further includes a gate contact 714 on and electrically coupled to gate 706, a source contact 716 on and electrically coupled to source region 702, and a drain contact 718 on and electrically coupled to drain region 704 as is illustrated in FIG. 7. In an embodiment, second transistor 720 has a source region 724, a drain region 722 and a gate 726. Second transistor 720 further includes a gate contact 734 on and electrically coupled to gate 726, a source contact 736 on and electrically coupled to source region 724, and a drain contact 738 on and electrically coupled to drain region 722.

In an embodiment, pSOT memory device 100 includes SOT electrode layer 102, tungsten insertion layer 103, free magnetic material layer 112, barrier layer 114, fixed magnetic material layer 116, synthetic antiferromagnetic layer 118, and terminal electrode 120. As discussed, tungsten insertion layer 103 is predominantly tungsten and may be pure or nearly pure tungsten. As shown, pSOT memory device 100 may also include sidewall dielectric layers 719. In an embodiment, SOT electrode layer 102 is adjacent to dielectric layer 750.

In an embodiment, a portion of SOT electrode layer 102 is in electrical contact with drain contact 738 of second transistor 720. A pSOT contact 728 is on and electrically coupled with terminal electrode 120 of pSOT memory device 100. In an embodiment, an interconnect metallization structure 740 is on and electrically coupled with insertion layer 103. In the illustrative embodiment, perpendicular spin orbit torque material stack 124 of pSOT memory device 100 is laterally between drain contact 738 and interconnect metallization structure 740. In some embodiments, perpendicular spin orbit torque material stack 124 is laterally closer to drain contact 738 than to interconnect metallization structure 740. In other embodiments, perpendicular spin orbit torque material stack 124 is laterally closer to interconnect metallization structure 740 than to drain contact 738. In some embodiments, perpendicular spin orbit torque material stack 124 is approximately mid-way, laterally, between interconnect metallization structure 740 and drain contact 738. As discussed, in some embodiments, the architecture of FIG. 7 may implement perpendicular spin orbit torque memory device 200 or perpendicular spin orbit torque memory device 300. Notably, when perpendicular spin orbit torque memory device 200 is implemented, interconnect metallization structure 740 lands on a thinner portion of insertion layer 103 and, when perpendicular spin orbit torque memory device 300 is implemented, interconnect metallization structure 740 lands on SOT electrode layer 102.

In the illustrative embodiment, interconnect metallization structure 740 is connected to a bit line (BL) 742 of a memory array. In an embodiment, BL 742 is connected to a spin orbit torque contact of a second spin orbit torque memory device (not shown). In an embodiment, pSOT contact 728 is electrically connected to a drain contact 718 of the first transistor 700 (indicated by the dashed line 780). In an embodiment, pSOT contact 728, when connected to drain contact 718 of first transistor 700 enables flow of a current through perpendicular spin orbit torque material stack 124. In an embodiment, source contact 716 of first transistor and source contact 736 of second transistor 720 are electrically connected to a shared source line (SL) 782. In an embodiment, gate contact 714 of first transistor 700 is electrically connected to a first word line ($WL_1$) 741 and gate contact 734 of second transistor 720 is electrically connected to a second word line ($WL_2$) 743, where $WL_1$ 741 and $WL_2$ 743 are independently programmable.

In an embodiment, when second transistor 720 is energized in a manner that causes charge current to flow through SOT electrode layer 102 and/or insertion layer 103, a spin hall current is generated in one or both of SOT electrode layer 102 and/or insertion layer 103 as discussed herein. The spin hall current exerts a torque on the magnetization of free magnetic material layer 112. In an embodiment, torque transfer from the spin hall current will change the direction of magnetization in free magnetic material layer 112. In an embodiment, by appropriately biasing first transistor 700 and second transistor 720, write and erase operations may be enabled in pSOT memory device 100. A read operation of pSOT memory device 100 may be enabled by applying a biasing voltage between 0.1-0.2V between SL 782 and BL 742 and by applying an appropriate gate voltage bias on $WL_2$ 743 to energize first transistor 700.

In an embodiment, substrate 701 provides a surface used to manufacture integrated circuits. In an embodiment, substrate 701 includes a suitable semiconductor material such as but not limited to, single crystal silicon, polycrystalline silicon and silicon on insulator (SOI). In some embodiments, substrate 701 includes other semiconductor materials, such as germanium, silicon germanium, or a suitable group III-V or group III-N compound. Substrate 701 may also include semiconductor materials, metals, dopants, and other materials commonly found in semiconductor substrates.

In an embodiment, first transistor 700 includes a gate stack formed of at least two layers, a gate dielectric layer 710 and a gate electrode layer 712 between sidewall spacers 708. Gate dielectric layer 710 may include one layer or a stack of layers including one or more of silicon oxide, silicon dioxide (SiO$_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Gate electrode layer 712 the first transistor 700 is on gate dielectric layer 710 and may consist of at least one P-type work function metal or N-type work function metal, depending on whether the transistor is to be a PMOS or an NMOS transistor. In some implementations, gate electrode layer 712 may consist of a stack of two or more metal layers, where one or more metal layers are work function metal layers and at least one metal layer is a conductive fill layer. For a PMOS transistor, metals that may be used for gate electrode layer 712 include ruthenium, palladium, platinum, cobalt, nickel, and conductive metal oxides. For an NMOS transistor, metals that may be used for gate electrode layer 712 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide.

Source region 702 and drain region 704 are within substrate 701 adjacent to the gate stack of first transistor 700. Source region 702 and drain region 704 are formed using either an implantation/diffusion process or an etching/deposition process. In the former process, dopants such as boron, aluminum, antimony, phosphorous, or arsenic may be ion-implanted into the substrate to form the source region 702 and drain region 704. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate source region 702 and drain region 704. In some implementations, source region 702 and drain region 704 are fabricated using a silicon alloy such as silicon germanium or silicon carbide. The epitaxially deposited silicon alloy may be doped in-situ with dopants such as boron, arsenic, or phosphorous. In further embodiments, source region 702 and drain region 704 are formed using one or more alternate semiconductor materials such as germanium or a suitable group III-V compound.

In an embodiment, second transistor 720 also includes a gate stack having of at least two layers, a gate dielectric layer 730 and a gate electrode layer 732 between sidewall spacers 748. Second transistor 720, and the components thereof, may have any characteristics discussed with respect to first transistor 700, is similar or substantially similar to the first transistor 700.

Figure 8:
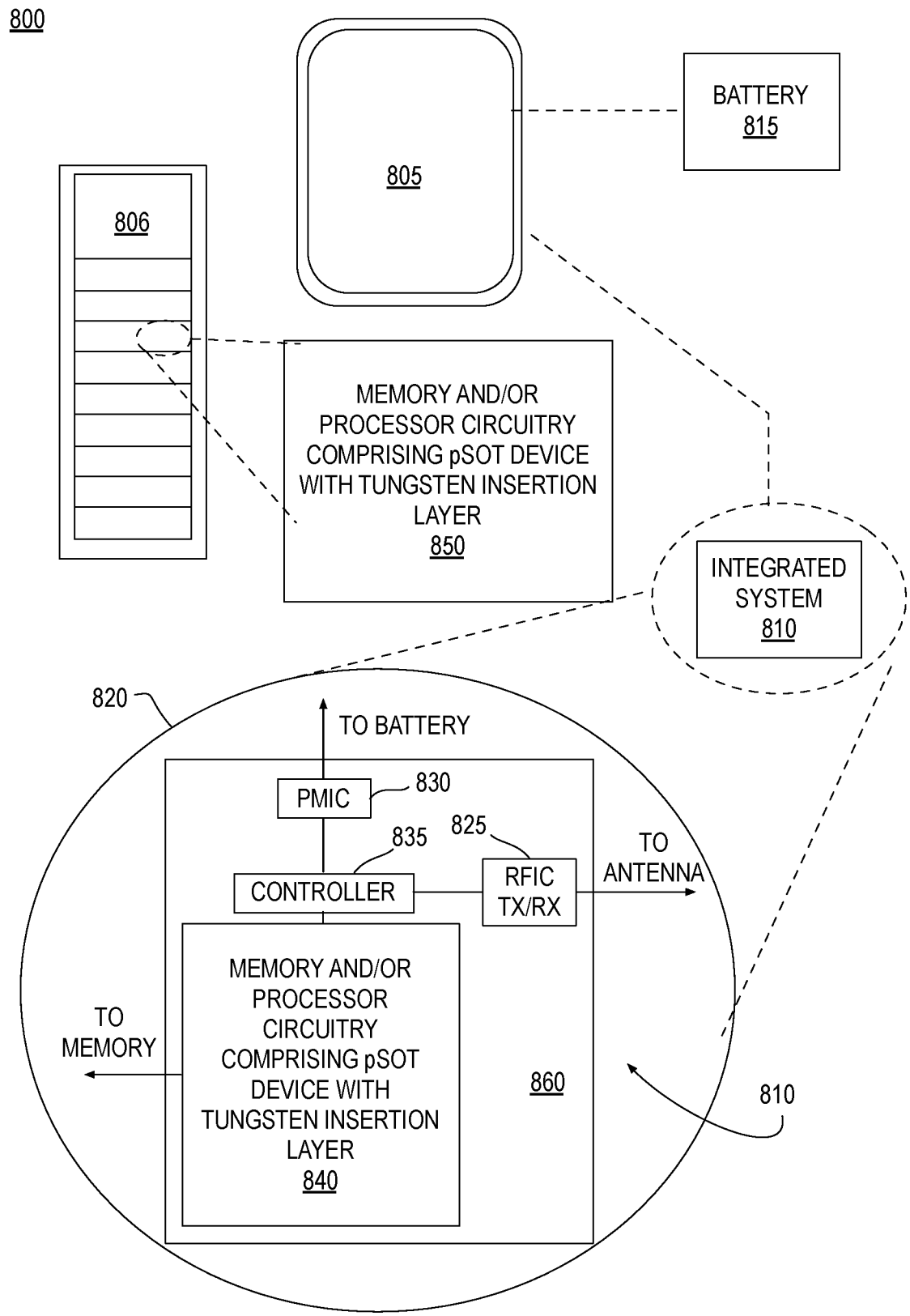
FIG. 8 illustrates a system in which a mobile computing platform and/or a data server machine employs a perpendicular spin orbit torque device having a predominantly tungsten insertion layer.

FIG. 8 illustrates a system 800 in which a mobile computing platform 805 and/or a data server machine 806 employs a perpendicular spin orbit torque device having a predominantly tungsten insertion layer, arranged in accordance with at least some implementations of the present disclosure. Data server machine 806 may be any commercial server, for example, including any number of high-performance computing platforms disposed within a rack and networked together for electronic data processing, which in the exemplary embodiment includes a packaged device 850.

For example, device 850 (e.g., a memory or processor) may include a perpendicular spin orbit torque device having a predominantly tungsten insertion layer (e.g., any of pSOT memory devices 100, 200, 300). In an embodiment, device 850 includes a non-volatile memory including a perpendicular spin orbit torque device having a predominantly tungsten insertion layer such as any perpendicular spin orbit torque device structure and/or material layer stack discussed herein. As discussed below, in some examples, device 850 may include a system on a chip (SOC) such as SOC 860, which is illustrated with respect to mobile computing platform 805.

Mobile computing platform 805 may be any portable device configured for each of electronic data display, electronic data processing, wireless electronic data transmission, or the like. For example, mobile computing platform 805 may be any of a tablet, a smart phone, a laptop computer, etc., and may include a display screen (e.g., a capacitive, inductive, resistive, or optical touchscreen), a chip-level or package-level integrated system 810, and a battery 815. Although illustrated with respect to mobile computing platform 805, in other examples, chip-level or package-level integrated system 810 and a battery 815 may be implemented in a desktop computing platform, an automotive computing platform, an internet of things platform, or the like.

Whether disposed within integrated system 810 illustrated in expanded view 820 or as a stand-alone packaged device within data server machine 806, SOC 860 may include memory circuitry and/or processor circuitry 840 (e.g., RAM, a microprocessor, a multi-core microprocessor, graphics processor, etc.), a PMIC 830, a controller 835, and a radio frequency integrated circuit (RFIC) 825 (e.g., including a wideband RF transmitter and/or receiver (TX/RX)). As shown, one or more perpendicular spin orbit torque devices having a predominantly tungsten insertion layer such as any perpendicular spin orbit torque device structures and/or material layer stacks discussed herein may be employed via memory circuitry and/or processor circuitry 840. In some embodiments, RFIC 825 includes a digital baseband and an analog front-end module further comprising a power amplifier on a transmit path and a low noise amplifier on a receive path). Functionally, PMIC 830 may perform battery power regulation, DC-to-DC conversion, etc., and so has an input coupled to battery 815, and an output providing a current supply to other functional modules. As further illustrated in FIG. 8, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 840 may provide memory functionality for SOC 860, high level control, data processing and the like for SOC 860. In alternative implementations, each of the SOC modules may be integrated onto separate ICs coupled to a package substrate, interposer, or board.

Figure 9:
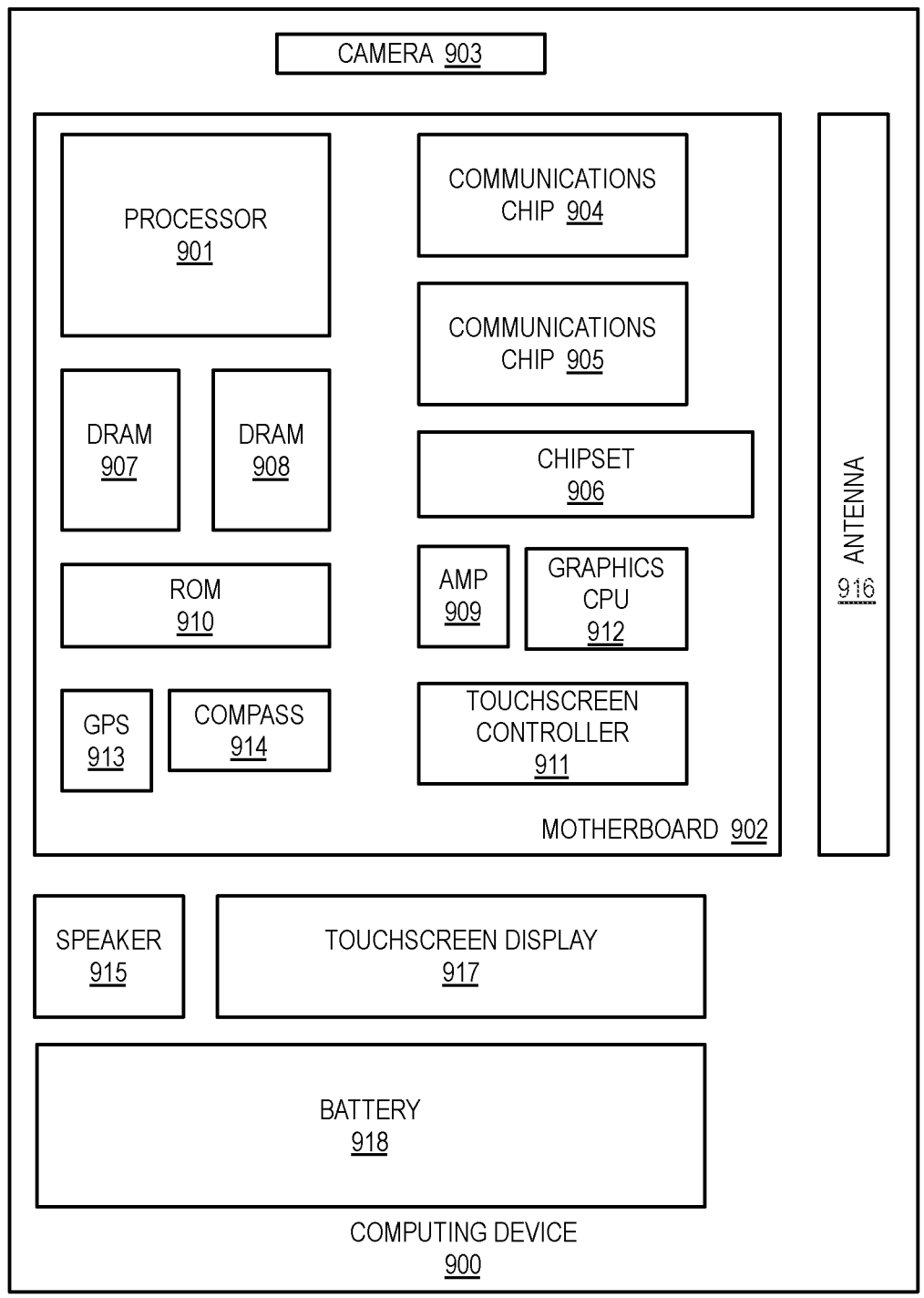
FIG. 9 illustrates a functional block diagram of a computing device, all arranged in accordance with at least some implementations of the present disclosure.

FIG. 9 illustrates a functional block diagram of a computing device 900, arranged in accordance with at least some implementations of the present disclosure. Computing device 900 or portions thereof may be implemented via one or both of data server machine 806 or mobile computing platform 805, for example, and further includes a motherboard 902 hosting a number of components, such as but not limited to a processor 901 (e.g., an applications processor)

and one or more communications chips 904, 905. Processor 901 may be physically and/or electrically coupled to motherboard 902. In some examples, processor 901 includes an integrated circuit die packaged within the processor 901. In general, the term "processor" may refer to any device or portion of a device that processes electronic data from registers and/or memory to transform that electronic data into other electronic data that may be stored in registers and/or memory.

In various examples, one or more communication chips 904, 905 may also be physically and/or electrically coupled to the motherboard 902. In further implementations, communication chips 904 may be part of processor 901. Depending on its applications, computing device 900 may include other components that may or may not be physically and electrically coupled to motherboard 902. These other components may include, but are not limited to, volatile memory (e.g., DRAM) 907, 908, non-volatile memory (e.g., ROM) 910, a graphics processor 912, flash memory, global positioning system (GPS) device 913, compass 914, a chipset 906, an antenna 916, a power amplifier 909, a touchscreen controller 911, a touchscreen display 917, a speaker 915, a camera 903, and a battery 918, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 904, 905 may enable wireless communications for the transfer of data to and from the computing device 900. For example, communication chips 904, 905 provide a wireless interface to allow processor 901 to communicate with another device (not shown). The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 904, 905 may implement any of a number of wireless standards or protocols, including but not limited to those described elsewhere herein. As discussed, computing device 900 may include a plurality of communication chips 904, 905. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, any component of computing device 900 may include or utilize one or more perpendicular spin orbit torque devices having a predominantly tungsten insertion layer such as any perpendicular spin orbit torque device structure(s) and/or material layer stack(s) discussed herein.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It will be recognized that the invention is not limited to the embodiments so described, but can be practiced with modification and alteration without departing from the scope of the appended claims. For example, the above embodiments may include specific combinations of features as further provided below.

The following examples pertain to further embodiments.

In one or more first embodiments, a perpendicular spin orbit torque (pSOT) device comprises a first electrode layer, a magnetic junction comprising a free magnetic material layer on the predominantly tungsten layer, and a second electrode layer over the fixed magnetic material layer.

In one or more second embodiments, further to the first embodiments, the predominantly tungsten layer is not less than 99% tungsten by weight and has a film thickness of not less than 0.05 nm.

In one or more third embodiments, further to the first or second embodiments, the film thickness is not more than 2 nm.

In one or more fourth embodiments, further to any of the first through third embodiments, the predominantly tungsten layer has a first film thickness between the first electrode layer and the free magnetic material layer and a second film thickness over the first electrode layer and external to the free magnetic material layer, wherein the first film thickness is greater than the second film thickness.

In one or more fifth embodiments, further to any of the first through fourth embodiments, the first film thickness is not less than 0.5 nm and the second film thickness is less than 0.5 nm.

In one or more sixth embodiments, further to any of the first through fifth embodiments, the predominantly tungsten layer is between the first electrode layer and the free magnetic material layer and is absent over the first electrode layer external to the free magnetic material layer.

In one or more seventh embodiments, further to any of the first through sixth embodiments, the first electrode layer comprises at least one of Ta, Pt, Hf, O, Co, Ir, or Mn.

In one or more eighth embodiments, further to any of the first through seventh embodiments, the first electrode layer comprises beta phase tantalum and the predominantly tungsten layer has a film thickness between the electrode layer and the free magnetic material layer of not less than 0.05 nm and not more than 1 nm.

In one or more ninth embodiments, further to any of the first through eighth embodiments, the magnetic junction further comprises a fixed magnetic material layer and a tunnel barrier layer between the free and fixed magnetic material layers, the free and fixed magnetic material layers each comprise Co, Fe, and B, the tunnel barrier layer comprises Mg and O, and the predominantly tungsten layer comprises not less than 99% tungsten by weight and has a film thickness of not less than 0.05 nm and not more than 2 nm between the first electrode layer and the free magnetic material layer.

In one or more tenth embodiments, further to any of the first through ninth embodiments, the pSOT device further comprises a synthetic antiferromagnetic (SAF) structure between the fixed magnetic material layer and the second electrode layer.

In one or more eleventh embodiments, an apparatus comprises a transistor over a substrate, the transistor comprising a drain contact, a source contact, and a gate contact, and a pSOT according to any of the first through tenth embodiments.

In one or more twelfth embodiments, a system comprises a processor, a memory coupled to the processor, the memory including a pSOT device according to any of the first through tenth embodiments, and a wireless interface to allow the processor to communicate with another device.

In one or more thirteenth embodiments, a method of forming a perpendicular spin orbit torque (pSOT) material stack comprises depositing a first electrode layer over a substrate, depositing a predominantly tungsten layer on the first electrode layer, depositing a first layer of amorphous CoFeB over the predominantly tungsten layer, depositing a first layer of dielectric material over the first layer of amorphous CoFeB, depositing a second layer of amorphous CoFeB over the first layer of dielectric material, and annealing the pSOT material stack to convert the first and second layers of amorphous CoFeB to polycrystalline CoFeB.

In one or more fourteenth embodiments, further to the thirteenth embodiments, depositing the predominantly tungsten layer comprises depositing the predominantly tungsten layer having not less than 99% tungsten to a film thickness of not less than 0.05 nm and not more than 1.5 nm.

In one or more fifteenth embodiments, further to the thirteenth or fourteenth embodiments, the method further comprises patterning the first layer of amorphous CoFeB, the first layer of dielectric material, and the second layer of amorphous CoFeB using a second electrode layer as a hardmask, wherein said patterning comprises an etch of an exposed portion of the predominantly tungsten layer to provide the predominantly tungsten layer with a first film thickness between the first electrode layer and the free magnetic material layer and a second film thickness less than the first film thickness over the first electrode layer and external to the free magnetic material layer.

In one or more sixteenth embodiments, further to any of the thirteenth through fifteenth embodiments, patterning the first layer of amorphous CoFeB, the first layer of dielectric material, the second layer of amorphous CoFeB, and the predominantly tungsten layer using a second electrode layer as a hardmask, wherein said patterning comprises an etch of an exposed portion of the predominantly tungsten layer to remove the exposed portion and provide the predominantly tungsten layer between the first electrode layer and the free magnetic material layer and absent over the first electrode layer external to the patterned free magnetic material layer.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A perpendicular spin orbit torque (pSOT) device, comprising:
   a first electrode layer comprising one of cobalt, a combination of hafnium and oxygen, or a combination of iridium and manganese;
   a predominantly tungsten layer on the first electrode layer;
   a magnetic junction comprising a free magnetic material layer on the predominantly tungsten layer, wherein the predominantly tungsten layer has a first film thickness between the first electrode layer and the free magnetic material layer and a second film thickness over the first electrode layer and external to the free magnetic material layer, wherein the first film thickness is greater than the second film thickness; and
   a second electrode layer over the magnetic junction.

2. The pSOT device of claim 1, wherein the predominantly tungsten layer is not less than 99% tungsten by weight and the first film thickness is not less than 0.05 nm.

3. The pSOT device of claim 2, wherein the first film thickness is not more than 2 nm.

4. The pSOT device of claim 1, wherein the first film thickness is not less than 0.5 nm and the second film thickness is less than 0.5 nm.

5. The pSOT device of claim 1, wherein the magnetic junction further comprises a fixed magnetic material layer and a tunnel barrier layer between the free and fixed magnetic material layers, the free and fixed magnetic material layers each comprise Co, Fe, and B, and the tunnel barrier layer comprises Mg and O.

6. A system comprising:
   a processor;
   a memory coupled to the processor, the memory comprising a perpendicular spin orbit torque (pSOT) device comprising:
      a first electrode layer comprising one of cobalt, a combination of hafnium and oxygen, or a combination of iridium and manganese;
      a predominantly tungsten layer on the first electrode layer;
      a magnetic junction comprising a free magnetic material layer on the predominantly tungsten layer, wherein the predominantly tungsten layer has a first film thickness between the first electrode layer and the free magnetic material layer and a second film thickness over the first electrode layer and external to the free magnetic material layer, wherein the first film thickness is greater than the second film thickness; and
      a second electrode layer over the magnetic junction; and
   a wireless interface to allow the processor to communicate with another device.

7. The system of claim 6, wherein the predominantly tungsten layer is not less than 99% tungsten by weight and the first film thickness is not less than 0.05 nm and not more than 2 nm.

8. The system of claim 6, wherein the magnetic junction further comprises a fixed magnetic material layer and a tunnel barrier layer between the free and fixed magnetic material layers, the free and fixed magnetic material layers each comprise Co, Fe, and B, and the tunnel barrier layer comprises Mg and O.

9. The system of claim 6, wherein the first electrode layer is not less than 99% cobalt by weight, not less than 99% the combination of hafnium and oxygen by weight, or not less than 99% the combination of iridium and manganese by weight, and the predominantly tungsten layer is not less than 99% tungsten by weight.

10. The pSOT device of claim 1, wherein the first electrode layer is not less than 99% cobalt by weight and the predominantly tungsten layer is not less than 99% tungsten by weight.

11. The pSOT device of claim 1, wherein the first electrode layer is not less than 99% the combination of hafnium and oxygen by weight and the predominantly tungsten layer is not less than 99% tungsten by weight.

12. The pSOT device of claim 1, wherein the first electrode layer is not less than 99% the combination of iridium and manganese by weight and the predominantly tungsten layer is not less than 99% tungsten by weight.

13. A perpendicular spin orbit torque (pSOT) device, comprising:
   a first electrode layer;
   a predominantly tungsten layer on the first electrode layer;
   a magnetic junction comprising a free magnetic material layer on the predominantly tungsten layer, wherein the predominantly tungsten layer has a first film thickness between the first electrode layer and the free magnetic material layer and a second film thickness over the first electrode layer and external to the free magnetic material layer, wherein the first film thickness is greater than the second film thickness; and a second electrode layer over the magnetic junction.

14. The pSOT device of claim 13, wherein the predominantly tungsten layer is not less than 99% tungsten by weight.

15. The pSOT device of claim 13, wherein the first film thickness is not less than 0.05 nm.

16. The pSOT device of claim 13, wherein the first film thickness is not more than 2 nm.

17. The pSOT device of claim 13, wherein the first film thickness is not less than 0.5 nm and the second film thickness is less than 0.5 nm.

18. The pSOT device of claim 13, wherein the magnetic junction further comprises a fixed magnetic material layer and a tunnel barrier layer between the free and fixed magnetic material layers.

19. The pSOT device of claim 18, wherein the free and fixed magnetic material layers each comprise Co, Fe, and B, and the tunnel barrier layer comprises Mg and O.

* * * * *